US007027470B2

(12) United States Patent
May

(10) Patent No.: US 7,027,470 B2
(45) Date of Patent: Apr. 11, 2006

(54) LASER WAVELENGTH LOCKER

(75) Inventor: Randy Dean May, Montrose, CA (US)

(73) Assignee: SpectraSensors, Inc., San Dimas, CA (US)

(*) Notice: Subject to any disclaimer, the term of this patent is extended or adjusted under 35 U.S.C. 154(b) by 200 days.

(21) Appl. No.: 10/639,241

(22) Filed: Aug. 11, 2003

(65) Prior Publication Data

US 2004/0066810 A1 Apr. 8, 2004

Related U.S. Application Data

(63) Continuation of application No. 10/090,936, filed on Mar. 5, 2002, now Pat. No. 6,671,296, which is a continuation-in-part of application No. 09/966,152, filed on Sep. 28, 2001, now Pat. No. 6,693,928, which is a continuation-in-part of application No. 09/811,090, filed on Mar. 17, 2001, now Pat. No. 6,567,433, which is a continuation-in-part of application No. 09/775,772, filed on Jan. 31, 2001, now Pat. No. 6,714,309, which is a continuation-in-part of application No. 09/685,212, filed on Oct. 10, 2000, now Pat. No. 6,587,484.

(51) Int. Cl.
*H01S 3/10* (2006.01)
*H01S 3/13* (2006.01)

(52) U.S. Cl. .......................................... 372/20; 372/32
(58) Field of Classification Search ................. 372/20
See application file for complete search history.

(56) References Cited

U.S. PATENT DOCUMENTS 6,157,502 A * 12/2000 Kathman .................... 359/819

(Continued)

FOREIGN PATENT DOCUMENTS

EP 0042158 A2 12/1981

(Continued)

OTHER PUBLICATIONS

Niemi, et al., "Simultaneous spectral filtering and wavelength monitoring of a DWDM transmitter using a tunable Fabry-Perot filter", *Optical Fiber Communication Conference (OFC). Technical Digest Postconference Edition*, Baltimore, Maryland, USA,, Mar. 7-10, 2000, New York, NY.

*Primary Examiner*—James Vannucci
(74) *Attorney, Agent, or Firm*—Fish & Richardson P.C.

(57) ABSTRACT

The method and system operate to maintain a widely tunable laser (WTL) at a selected transmission wavelength. To lock the WTL to an ITU grid line, a portion of the output beam from the WTL is routed through the etalon to split the beam into a transmission line for detection by an etalon fringe detector. Another portion of the beam is routed directly to a laser wavelength detector to determine the power of the beam. A wavelength-locking controller compares signals from the two detectors and adjusts the temperature of the etalon to align the wavelength of one of the transmission lines of the etalon with the wavelength of the output beam, then controls the WTL in a feedback loop to lock the laser to the etalon line. The wavelength-locking controller thereafter monitors the temperature of the etalon and keeps the temperature constant to prevent any wavelength drift attributable to the etalon.

42 Claims, 29 Drawing Sheets

U.S. PATENT DOCUMENTS

| | | |
|---|---|---|
| 6,243,403 B1 | 6/2001 | Broutin et al. |
| 6,396,605 B1 * | 5/2002 | Heflinger et al. ............ 398/140 |
| 6,556,752 B1 * | 4/2003 | Fang et al. .................... 385/52 |
| 6,678,432 B1 * | 1/2004 | Shigeta et al. ................. 385/14 |
| 6,693,928 B1 * | 2/2004 | May ............................ 372/19 |
| 6,711,188 B1 * | 3/2004 | Ito et al. ........................ 372/32 |
| 6,762,119 B1 * | 7/2004 | Ray et al. ..................... 438/614 |
| 2001/0022793 A1 * | 9/2001 | Yokoyama ............... 372/29.02 |

FOREIGN PATENT DOCUMENTS

| | | |
|---|---|---|
| EP | 0568242 A1 | 11/1993 |
| EP | 0773640 A2 | 5/1997 |
| EP | 0967698 A2 | 12/1999 |
| JP | 02-244782 | 9/1990 |
| SU | 1497565 | 7/1989 |
| WO | WO 95/29521 | 11/1995 |
| WO | WO 99/46836 | 9/1999 |

* cited by examiner

LASER WAVELENGTH LOCKER

RELATED APPLICATIONS

This patent application is a Continuation of U.S. patent application Ser. No. 10/090,936, entitled "Method and System for Locking Transmission Wavelengths for Lasers in a Dense Wavelength Division Multiplexer Utilizing a Tunable Etalon", filed Mar. 5, 2002, now U.S. Pat. No. 6,671,296, which is a Continuation-in-Part of U.S. patent application Ser. No. 09/966,152, of Randy May also entitled "Method and System for Locking Transmission Wavelengths for Lasers in a Dense Wavelength Division Multiplexer", filed Sep. 28, 2001, now U.S. Pat. No. 6,693,928, which is a Continuation-in-Part of U.S. patent application Ser. No. 09/811,090, of Randy May also entitled "Method and System for Locking Transmission Wavelengths for Lasers in a Dense Wavelength Division Multiplexer", filed Mar. 17, 2001, now U.S. Pat. No. 6,567,433, which is a Continuation-in-Part of U.S. patent application Ser. No. 09/775,772, filed Jan. 31, 2001, now U.S. Pat. No. 6,714,309, which is a Continuation-in-Part of U.S. patent application Ser. No. 09/685,212, entitled "Method And Apparatus For Determining Transmission Wavelengths For Lasers In A Dense Wavelength Division Multiplexer", filed Oct. 10, 2000 now U.S. Pat. No. 6,587,484.

BACKGROUND OF THE INVENTION

I. Field of the Invention

The invention generally relates to dense wavelength division multiplexers (DWDM) and in particular to a technique for locking transmission wavelengths of individual lasers of the DWDM.

II. Description of the Related Art

A DWDM is a device for simultaneously transmitting a set of discrete information channels over a single fiber optic transmission line. A conventional fiber optic transmission line is capable of reliably transmitting signals within a bandwidth of 1280 to 1625 nanometers (nm), the "low loss" region for silica fiber. Within that overall bandwidth, the International Telecommunications Union (ITU) has defined various transmission bands and specified certain transmission channel protocols for use within each transmission band. One example of a transmission band is the ITU "C" band, which extends 40 nm from 1525 nm to 1565 nm. Within the C band, specific transmission channel protocols of 40, 80, or 160 discrete channels are defined and, for each protocol, the ITU has defined a grid of transmission wavelengths, with each line corresponding to an acceptable transmission wavelength. The protocols have been defined to ensure that all DWDM transmission and reception equipment are fabricated to operate at the same wavelengths. For the 40-channel protocol, the corresponding ITU grid has 40 lines with channel spacing of 0.8 nm; for the 80-channel protocol, the corresponding ITU grid has 80 lines with channel spacing of 0.4 nm; and so forth. Additional protocols have been proposed, including 320 channel and 640 channel protocols. Maximum theoretical transmission frequencies for the various ITU protocols are as follows: 100 GHz for the 40 channel protocol; 50 GHz for the 80 channel protocol; 25 GHz for the 160 channel protocol; 12.5 GHz for the 320 channel protocol; and 6.25 GHz for the 640 channel protocol. Closer channel spacing necessitates a lower modulation rate since channel spacing must be larger than the modulation frequency. High frequency modulation requires suitable optic fibers, as well as appropriate transmission and receiving equipment. Current state-of-the-art DWDMs typically employ a 40 channel ITU protocol but transmit at 2.5 GHz, well below the theoretical maximum. Other exemplary ITU transmission bands are the S- and L-bands.

To simultaneously transmit the set of channels on a fiber optic cable, a conventional DWDM employs a set of the individual distributed feedback (DFB) lasers, with one DFB laser per channel and with the DFB configured to transmit. FIG. 1 illustrates a DWDM 100 having forty individual DFB lasers 102 for transmitting optical signals via a single optic fiber 104. An optical multiplexer 106 couples signals received from the individual DFBs via a set of intermediate optic fibers 107 into output optic fiber 104. Each DFB laser transmits at a different wavelength of the 40-channel ITU C band. This enables forty separate channels of information to be transmitted via the single optical fiber 104 to a de-multiplexer (not shown) provided at the far end of the optical fiber.

To permit the DWDM to transmit forty separate channels simultaneously, each individual DFB must be tuned to a single ITU transmission channel wavelength. A DFB laser can be tuned only within a narrow wavelength band, typically about 2 nm in width. Hence, for the 40-channel protocol of the ITU C band having 0.8 nm transmission line spacing, the typical DFB can only be tuned to one of a few adjacent lines out of the total of 40 lines of the ITU grid. Traditionally each individual DFB laser is manually calibrated at the factory to emit at a corresponding one of the ITU transmission lines. This is achieved by adjusting the laser operating temperature and current to obtain the desired wavelength.

The laser is then, in some implementations, locked to the target wavelength by routing the output beam from each DFB laser through a corresponding manually tunable etalon. (The etalons are not shown in FIG. 1.) A manually tunable etalon is an optical device that produces a periodically-varying transmission spectrum as a function of laser wavelength. By tilting the etalon relative to the DFB laser beam path, a transmission peak of the etalon can be made coincident with the target ITU channel. The wavelength of an etalon transmission peak is calibrated to one of the ITU transmission lines by manually adjusting the angle of the etalon while monitoring the wavelength output from the etalon using an optical wavelength analyzer. The angle of the etalon is adjusted until the output wavelength is properly aligned with one of the ITU transmission lines, then the etalon is mounted in place in an attempt to lock the output wavelength of etalon to the selected ITU transmission line. This is a difficult and time-consuming process requiring skilled technicians resulting in the alignment of the etalon transmission peaks with several ITU transmission lines. In addition, if transmission over a certain range of ITU transmission lines is desired, multiple tunable lasers are required to ensure adequate coverage. Such an arrangement is costly and does not provide rapid switching between ITU transmission lines. Furthermore, mechanical or thermal drift of the etalon over time often moves the transmission peak away from the target ITU channel, which requires recalibration.

Once the DFB lasers of a single DWDM are properly aligned with the ITU grid, the DWDM may then be used for transmitting signals over a fiber optic line, such as for transmitting digital data over computer networks or for transmitting television signals from a television network to one of its affiliates. A single DWDM must be provided for use with each fiber optic line employed for DWDM transmissions and hence a single customer installation, such as a television broadcast center, may require large numbers of DWDMs. If one of the DFB lasers within a DWDM drifts from its corresponding ITU transmission line or otherwise malfunctions, the entire DWDM typically needs to be replaced to permit the malfunctioning DWDM to be returned to the factory to be re-calibrated or otherwise fixed. As a result, the cost of maintaining a set of DWDMs is often substantial. To help remedy this problem, some DWDMs are provided with an additional widely tunable laser (WTL), which can be tuned separately to any one of the ITU grid lines. Hence, if one of the DFB lasers malfunctions, the single WTL can be tuned to the corresponding transmission wavelength of the DFB to thereby permit the DWDM to continue to operate. Additional WTLs can be supplied with a DWDM to accommodate the failure of two or more DFB channels, and such "sparing" is a major advantage a WTL over a DFB. However, conventional WTLs cannot simply and accurately be tuned to any target ITU channel at a customer installation and must be calibrated at the factory for operation at a specific channel.

Another problem associated with employing DFB lasers within DWDMs is that, because each DFB laser can only be tuned within a narrow range of about 2 nm, each DFB laser can only be calibrated to one of a few adjacent ITU transmission wavelength lines. It is sometimes desirable to configure the DWDM to use many lasers for transmitting at a single ITU transmission line to provide more bandwidth on that channel. When using DFB lasers, no more than two or three of the lasers can be calibrated to a single ITU transmission line. Hence, in some DWDMs, WTLs are used exclusively instead of DFB lasers, thus permitting any of the lasers to be manually calibrated at the customers installation to transmit on any of the ITU transmission lines. Although the use of WTLs remedies many of the problems associated with using DFB lasers, WTLs are difficult and expensive to fabricate and initially calibrate, and are susceptible to wavelength drift requiring frequent recalibration at the customers installation by trained technicians and hence necessitating high overall installation and maintenance costs.

Thus, whether using DFB lasers or WTLs within a DWDM, significant problems arise in achieving and maintaining proper wavelength calibration of the lasers to permit reliable operation of the DWDM. Accordingly, there was a need to provide an efficient method and system for calibrating transmission lasers within a DWDM and it was to that end that the invention of the senior parent applications were primarily directed. Briefly, the senior parent patent applications involve, inter alia, techniques for calibrating a transmission WTL of a DWDM using an etalon and a gas cell having acetylene, hydrogen cyanide or carbon dioxide. Initially, the absolute transmission wavelengths of the WTL are calibrated by routing an output beam from the WTL through the etalon and through the gas cell while varying tuning parameters of the WTL to thereby generate an etalon spectrum and a gas absorption spectrum both as functions of the tuning parameters. The etalon and gas absorption spectra are compared, along with input reference information specifying gas absorption as a function of absolute wavelength, to determine the absolute transmission wavelength for the WTL as a function of the tuning parameters. The WTL is then tuned to align the transmission wavelength of the WTL to an ITU transmission grid line. By tuning the output wavelength of the WTL using an etalon in combination with a gas absorption cell, the WTL can be quickly, easily and precisely set to a selected ITU transmission grid line at a customer installation. The tuning process can be periodically repeated to maintain precise tuning of the WTL despite possible temperature or mechanical drift of the various components. In one implementation, a wavelength mapper is provided for manually connecting to a WTL to tune the WTL to a selected ITU transmission gridline. In another implementation, the wavelength mapper is permanently attached to the WTL along with a wavelength locker to lock the WTL to an ITU transmission gridline.

Insofar as wavelength locking is concerned, the parent applications describe a wavelength locker employing a temperature-controlled etalon. After the aforementioned wavelength mapping steps are performed to determine the absolute wavelength of the laser as a function of the laser tuning parameters, tuning parameters are applied to the laser to tune the laser to a selected transmission wavelength, such as an ITU channel wavelength. A temperature offset is applied to the etalon of the wavelength locker to vary the wavelengths of the transmission peaks of the etalon until one of the transmission peaks is precisely aligned with the selected wavelength. Any drift of the laser from the etalon transmission peak is detected and the tuning parameters applied to the laser are automatically adjusted to compensate for the drift. The temperature of the etalon is precisely maintained so that the etalon transmission peak does not drift from the selected wavelength. In this manner, the main output beam of the laser remains locked on the absolute wavelength of the selected transmission channel despite possible variations in the output characteristics of the laser. Periodically, the system can be recalibrated using the known absolute wavelengths of the gas absorption chamber to ensure that the transmission peak of the etalon has not drifted from the absolute wavelength of the selected transmission channel.

Although the parent applications describe highly useful techniques for mapping the transmission wavelengths of lasers within a DWDM and for locking the transmission wavelengths to ITU grid lines, room for further improvement remains, particularly insofar as the design and fabrication of the wavelength locker is concerned. For practical applications, the wavelength locker should be highly miniaturized and configured so as to consume relatively little power. The wavelength locker also should be sufficiently durable to operate reliably over a ten- or twenty-year lifetime. Ideally, the wavelength locker should be designed so as to work in combination with any of a wide variety of ITU transmission protocols and fiber optic transmission rates, both existing and proposed and to allow rapid switching between ITU grid lines. Perhaps most importantly, the wavelength locker should be designed so as to be sufficiently inexpensive for practical use. Difficulties arise in each of these areas.

Each WTL for use in a DWDM is typically provided in a miniature "butterfly" package for mounting to a circuit board also containing microcontrollers and other components. The circuit boards are mounted in a parallel array within the DWDM with, typically, one board per ITU channel. Hence, a forty ITU channel DWDM employs forty circuit boards; an eighty ITU channel DWDM employs eighty circuit boards. Current state-of-the-art WTLs typically draw about ten watts of power, thus requiring 400 watts of power or more for the a forty channel DWDM and correspondingly more power for 80 or 160 channel DWDMs. A significant portion of the power is consumed by thermoelectric (TE) coolers provided for controlling the temperature of the semiconductor laser of the WTL. With the WTLs already consuming considerable power, it is particularly important that the wavelength locker be configured so as to minimize power consumption, particularly the temperature-controlled etalon. Minimizing power consumption, however, typically requires that the etalon be configured to provide numerous closely-spaced transmission peaks (i.e. to have a narrow free spectral range) such that relatively little heating or cooling is required to expand or contract the etalon or change its index of refraction sufficiently enough to align one of the transmission lines of the etalon with a selected ITU grid line. Using numerous closely spaced peaks, however, increases the risk that the wavelength locker will lock the transmission wavelength of the WTL to the wrong wavelength. Also, to provide numerous closely-spaced transmission peaks, the etalon typically must be configured to have a very short optical axis, thereby making it more difficult to fabricate and align.

Moreover, difficulties arise in adequately insulating the temperature-controlled etalon so as to minimize power loss and to ensure a minimal temperature gradient within the etalon. Any significant temperature gradient within the etalon tends to degrade the finesse of the etalon (i.e. the sharpness of the individual etalon lines) thus making it difficult to achieve precise wavelength locking. Likewise, any slight misalignment of the etalon or any slight imprecision in reflection coatings of the etalon reduces the degree of finesses. Lack of adequate insulation, of course, also increases power consumption and generates a greater amount of waste heat, which may affect the ability of the TE cooler of the laser to efficiently control the temperature of the laser, particularly if the etalon is mounted closely adjacent to the laser within the butterfly package. Typically, manufacturing protocols for DWDMs specify that the DWDM must operate at 70 degrees Celsius or less, thus putting further limitations on the design of the temperature-controlled etalon. It is difficult, therefore, to provide a temperature-controlled etalon and other wavelength locker, which achieves the requisite degree of finesse for precise wavelength locking while also minimizing power consumption, even for use with just one ITU channel protocol. Ideally, however, the temperature-controlled etalon and other components of the wavelength locker should be configured to work with any of a variety of ITU channel protocols, such as 40 to 640 channels, and with any of a variety of transmission frequencies, such as from 2.5 GHz to 100 GHz. Also, ideally, the wavelength locker is sufficiently miniaturized to mount inside the butterfly package of the WTL to minimize overall circuit board space.

For all of the foregoing reasons, it was desirable to provide improved methods and systems for implementing a wavelength locker for use in locking the transmission wavelength of a laser of a DWDM, which is highly miniaturized, achieves low implementation costs and operating costs, consumes relatively little power, works in combination with any of a wide variety of ITU transmission protocols, rapidly switches between ITU grid lines, and is sufficiently durable to reliably operate for ten to twenty years.

The invention first described in the parent application filed Jan. 31, 2001 was directed to providing just such an improved wavelength locker. Briefly, to lock a WTL to an ITU grid line, a portion of the output beam from the WTL is routed through the etalon to split the beam into a set of transmission lines for detection by a detector. Another portion of the beam is routed directly to a laser wavelength detector via a beam splitter interposed between the laser and the etalon. A wavelength-locking controller compares the signals from the two detectors and adjusts the temperature of the etalon to align the wavelength of one of the transmission lines of the etalon with the wavelength of the output beam. In this arrangement, the wavelength-locking controller operates to control the WTL in a feedback loop to lock the laser to the etalon line. The wavelength-locking controller thereafter monitors the temperature of the etalon and keeps the temperature constant to prevent any wavelength drift in the etalon. In one specific example, the etalon is a silicon etalon configured to have finesse of about 20 and to provide a free spectral range of about 8 GHz. With these parameters, the system is able to lock the wavelength of the WTL to within a precision of about 0.2 GHz. In another example, the etalon is first calibrated during manufacture to determine a "set point" operating temperature sufficient to align transmission peaks of the etalon with desired ITU grid lines. The etalon is thereafter mounted within a WTL and the etalon is adjusted to the set point temperature so as to align transmission peaks of the etalon with the desired ITU grid lines to permit wavelength locking. This later technique allows for rapid switching between channels and obviates the need for a gas cell within the WTL.

Still further improvements are achievable. In particular, with the arrangement just summarized, a beam splitter is employed to split the laser beam into two beams—one to the laser wavelength detector and another to the etalon. The beam splitter causes amplitude variations in the two beams, which are out of phase from one another making it more difficult to lock the laser to one of the ITU channels. Accordingly, it was desirable to provide an alternative configuration permitting easier wavelength locking. The invention first described in the parent application filed Sep. 28, 2001 was partly directed to providing just such a configuration. Briefly, a wavelength locker was provided wherein the laser wavelength detector receives a portion of the laser beam (to detect the power of the laser beam) directly from the laser so that phase characteristics of the laser beam are not affected by an intervening beamsplitter thereby permitting improved wavelength locking. In one example, the laser, the laser wavelength detector, the etalon and the etalon wavelength detector are all positioned along a common axis, with the laser wavelength detector interposed between the laser and the etalon. The laser wavelength detector is offset slightly from the common axis to permit most of the laser beam to pass directly to the etalon while capturing a smaller portion of the beam for use in detecting the wavelength of the laser. The laser wavelength detector preferably captures 30% of the beam of the laser, permitting the etalon to capture the remaining 70%, and thereby achieving a lock point ratio of about 1.0 for use in side locking. By positioning the laser wavelength detector along the initial linear portion of the optical path of the laser, the laser wavelength detector directly receives a portion of the output beam from the laser and hence the amplitude of the beam as a function of wavelength is unaffected, as might otherwise occur with the detector positioned off-axis and a beam splitter employed to reflect a portion of the laser beam to the detector.

Another concern lies in the possibility of optical frequency chirp affecting signals transmitted along the optic fiber at one of the ITU gridline wavelengths. Briefly, optical chirp occurs when a current source used to modulate the transmission laser causes dynamic changes in the index of refraction of a laser junction or other optical transmitter. A dynamic change in the index of refraction in turn causes a dynamic change in the actual transmission frequency of an optical pulse transmitted into the optic fiber. As a result, the time average of the optical transmission may indicate that a leading edge of an optical pulse has a slightly different frequency than the trailing edge of the pulse. Although the initial frequency differential between the leading and trailing edges of the pulse may be slight, chromatic dispersion inherent in optic fibers causes the leading and trailing edges to propagate at different speeds resulting in potentially significant distortion of the optical pulse, particularly over long haul optic fiber transmission systems. The distortion limits either the maximum frequency of signal transmission modulation or the maximum distance at which signals can be reliably transmitted.

Accordingly, it was desirable to provide a system for limiting optical frequency chirp, particularly for use within system transmitting on ITU channel wavelengths and other aspects of the invention described in the parent application filed Sep. 28, 2001 were directed to providing just such a system. In one example, the system includes a laser controlled to transmit at a frequency selected from a group of channel frequencies having fixed wavelength spacing. An etalon is mounted between the laser and an output optic fiber. The etalon has a free spectral range (FSR) equal to the fixed wavelength spacing and is tuned so that fringes produced by the etalon are aligned with the transmission channels. Preferably, the etalon has a finesse set such that the width of the fringe is approximately 1 GHz. By aligning the fringes of the etalon with the transmission channel frequencies, only those portions of signals transmitted at frequencies aligned with one of the selected transmission frequencies are passed by the etalon. Portions of signals with frequencies offset from the selected transmission frequencies are filtered out, including any portions of signals having a frequency offset as a result of transmission signal chirp. In this manner, chirp is reduced or completely eliminated by the etalon regardless of which of the selected frequencies is used for transmitting the signals. With chirp eliminated, the signals can be reliably transmitted over longer fiber optic cables with higher modulation rates.

Still further room for improvement remains, particularly insofar as configuring the wavelength locker such that phase characteristics of the laser beam are not affected by any intervening beam splitters so as to permit improved wavelength locking. As noted, in the technique of the parent application filed Sep. 28, 2001, the laser wavelength detector is offset slightly from the common axis of the wavelength locker to permit most of the laser beam to pass directly to the etalon while capturing a smaller portion of the beam (to detect the power of the laser beam) for use in detecting the wavelength of the laser. Although the off-set wavelength locker is effective in eliminating the need for beam splitters, certain design and fabrication issues arise as a result of the need to offset the laser wavelength detector relative to the other optical components. In the example described, both the laser wavelength detector and etalon detector are the same size. The laser wavelength detector is preferably offset from the center of the laser beam so as to capture only 30% of the input beam while permitting the remaining 70% to pass on to the etalon so as to achieve a lock point ratio of about 1.0. In other words, the laser wavelength detector is positioned so as to extend into the laser beam just enough to occlude 30% of the beam. This can be achieved by first determining the amount of offset required to occlude 30% of the laser beam based on the diameter of the detector and on the intensity profile of the laser beam. However, if the laser beam is either non-collimated or collimated using only a relatively inexpensive ball lens, the intensity profile can be relatively imprecise, such that an accurate offset cannot be easily determined in advance. The wavelength locker can be designed to incorporate a more precise collimator, such as an aspheric lens or a graded index (GRIN) lens, but such collimators are relatively expensive. Moreover, even if the correct offset can be calculated in advance, manufacturing tolerances may be such that it is difficult to achieve the offset during automated fabrication. In this regard, a small variation in the offset of the laser wavelength detector can result in a fairly significant variation in the relative beam percentages captured by the two detectors. The laser wavelength detector can be manually adjusted during fabrication until it occludes 30% of the laser beam, but manual adjustment is relatively expensive and time-consuming. Although, achieving a precise lock point ratio of 1.0 is not critical, it is certainly preferred and, accordingly, it would be desirable to provide an alternative configuration of the wavelength locker which permits the lock point ratio of 1.0 to be more readily achieved and it is to this end that aspects of the invention of the present Continuation-In-Part application are directed.

Also, there is room for further improvement in the manner by which the components of the wavelength locker are mounted. In the examples described in the various parent applications, epoxy is typically used to mount the various optical components to a base or substrate. However, concerns arise with respect to the reliability is of epoxy, and particularly with regard to the possibility of out-gassing of material from the epoxy with time, which could coat or otherwise damage the optical components. Accordingly, it would also be desirable to provide an improved mounting arrangement, which does not employ epoxy but which nevertheless provides easy and reliable mounting. It is to this end that other aspects of the invention of the present Continuation-In-Part application are directed.

SUMMARY OF THE INVENTION

In accordance with one aspect of the invention, a system and method is provided for use in locking a laser beam to a transmission wavelength using a tunable etalon. The system includes a laser wavelength detector, positioned along an optical path of the laser beam, for capturing a first portion of the laser beam to detect the power of the laser. An etalon is positioned along the optical path of the laser beam downstream from the laser wavelength detector for simultaneously receiving a second portion of the laser beam and for splitting the second portion into a series of transmission lines. An etalon wavelength detector is positioned along the optical path of the laser beam downstream from the etalon wavelength detector for detecting the power of the etalon transmission line. The laser wavelength detector and the etalon wavelength detector are both offset from one another and from a central axis of the laser beam and collectively provide a combined detection area smaller than a beam width of the laser beam. Preferably, the system also includes a control unit for setting the transmission wavelength of the output beam of the laser to a selected wavelength and for tuning the etalon to align a selected etalon transmission line to the selected wavelength. The wavelength-locking control unit thereafter detects any drift of the transmission wavelength of the laser from the selected etalon transmission line and adjusts the laser to compensate for any drift, such that the output beam of the laser is locked to the selected transmission wavelength so long as the selected etalon transmission line remains at the selected wavelength.

In an exemplary embodiment, the wavelength locker is configured for use with a laser beam having a Gaussian intensity profile and a beam width of more than 450 microns. The laser wavelength detector and the etalon wavelength detector are both circular detectors, with the laser wavelength detector having a detection area about 150 microns in diameter and the etalon wavelength detector having a detection area about 300 microns in diameter. With this configuration, the detection areas of both the laser wavelength detector and the etalon wavelength detector are positioned completely within the laser beam. The relative sizes of the detectors, in combination with the Gaussian intensity profile of the laser beam, ensures that the ratio of light captured by the etalon detector to that of the laser wavelength detector is about 7/3 thus providing a lock point ratio of about 1.0. Hence, the appropriate lock point ratio is achieved. Beam splitters are not required and so phase characteristics of the laser beam are not adversely affected. Moreover, because the lock point ratio is determined primarily by the relative sizes of the detectors, rather than their relative locations, slight variations in the locations of the detectors as a result of manufacturing tolerances do not result in any significant variation in the lock point ratio. This is in contrast to the arrangement summarized above wherein the laser wavelength detector extends into the laser beam by the amount necessary to occlude 30% of the beam and wherein small variations in the position of the laser wavelength detector can result in a more significant variation in the relative beam percentages captured by the two detectors. Hence, the alignment issues discussed above are largely eliminated. Furthermore, if the input beam is to be collimated, a relatively inexpensive ball lens can be used to provide collimation, rather than a more expensive aspheric lens or GRIN lens. The fact that the resulting collimated beam may be relatively imprecise does not effect the position or alignment of the detectors—so long as the resulting beam width is somewhat larger than the combined diameters of the two detectors. Hence, cost savings can be achieved relative to wavelength lockers employing an aspheric or GRIN lens.

In accordance with another aspect of the invention, another system and method is provided for use in locking a laser beam to a transmission wavelength using a tunable etalon. The system includes a laser wavelength detector, an etalon, and an etalon wavelength detector all mounted to an optical bench. The laser wavelength detector is mounted to the optical bench, preferable made of silicon, aluminum nitride, or other material that is thermally conductive and has desired mechanical properties, along an optical path of the laser beam for use in capturing a first portion of the laser beam so as to detect the power of the laser. The etalon is mounted to the optical bench downstream from the laser wavelength detector for simultaneously receiving a second portion of the laser beam and for splitting the second portion into a series of transmission lines. The etalon wavelength detector is mounted on the optical bench downstream from the etalon wavelength detector for detecting the etalon transmission lines (and thus the power of the transmitted beam filtered by the etalon). Preferably, the system also includes a control unit for setting the transmission wavelength of the output beam of the laser to a selected wavelength and for tuning the etalon to align a selected etalon transmission line to the selected wavelength. The wavelength-locking control unit thereafter detects any drift of the transmission wavelength of the laser from the selected etalon transmission line and adjusts the laser to compensate for any drift, such that the output beam of the laser is locked to the selected transmission wavelength so long as the selected etalon transmission line remains at the selected wavelength.

In an exemplary embodiment, the laser beam is provided by an optic fiber that is also mounted to the optical bench. A ball lens is mounted to the optical bench between the optic fiber and the laser wavelength detector. The laser wavelength detector, the etalon, the etalon wavelength detector, the lens and the optic fiber are all affixed to the optical bench via eutectic coupling. In turn, the optical bench is mounted to a base formed of FR4 or polyimide with a heating element positioned between the optical bench and the base. Eutectic coupling may be achieved by metalizing bottom portions of the various components and the top portion of the optimal bench, then a preform is placed on the optical bench (preferably made out of Au/Sn in a ratio of 80%/20%). The components are then placed on the optical bench and the components, the bench, and the preform are optical bench sufficiently heated (i.e., 283° C. for Au/Sn) to induce eutectic bonding between the metalized portions of the components and the optical bench. By affixing the various components to the optical bench via eutectic coupling, problems that may otherwise arise when using epoxy are thereby avoided. Also, more uniform heating of the optical components is achieved using an optical bench as opposed to other mounting platforms. Moreover, mounting and alignment of the various components is facilitated by appropriate configuration of the optical bench. To this end, the optical bench is fabricated to have various slots sized to receive portions of the laser wavelength detector, the etalon, the etalon wavelength detector, the lens and the optic fiber and positioned so as to properly align the various components. Conventional fabrication techniques may be used to shape the bench so as to provide the requisite slots. Thereafter, during fabrication, the various components are merely placed into their respective slots to thereby properly align the components and then the entire apparatus is heated so as to induce eutectic coupling to thereby lock the components into position.

In yet another embodiment, a laser system is provided that includes a laser for generating a laser beam and a laser wavelength detector, positioned along an optical path of the laser beam, for capturing a first portion of the laser beam to detect the power of the laser. Interposed between the optical path of the laser and the laser wavelength detector, is an etalon for simultaneously receiving a second portion of the laser beam and for splitting the second portion into a series of transmission lines. An etalon wavelength detector positioned along the optical path of the laser beam downstream from the etalon detects the power of transmitted etalon transmission lines. A control unit, which may be internal or external to the sets the transmission wavelength of the laser to a selected wavelength and tunes the etalon to align a selected one of the etalon transmission lines to the selected wavelength. If the control unit thereafter detects any drift of the transmission wavelength of the laser from the selected etalon transmission line, the laser is adjusted to compensate for any such drift. Preferably, the laser wavelength detector and etalon wavelength detector are offset from one another and from a central axis of the laser beam and collectively provide a combined detection area smaller than a beam width of the laser beam. In some embodiments, the laser is part of a laser multiplexer system that includes a plurality of lasers each operative to generate a respective laser beam where a plurality of lockers operate to lock the wavelength of a respective one of the lasers to a respective transmission wavelength, and an optical multiplexer operates to combine the plurality of laser beams into an optic fiber for transmission. In other embodiments, the components of the locker are Preferably, the optical bench is configured for use with the detector arrangement summarized above wherein the laser wavelength detector and the etalon wavelength detector are both positioned within the laser beam but are offset from one another, such that the advantages of that arrangement are exploited as well.

Other features and advantages of the invention are described below.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION OF THE EXEMPLARY EMBODIMENTS

With reference to the remaining figures, exemplary embodiments of the invention will now be described.

Wavelength Mapper

Figure 1:
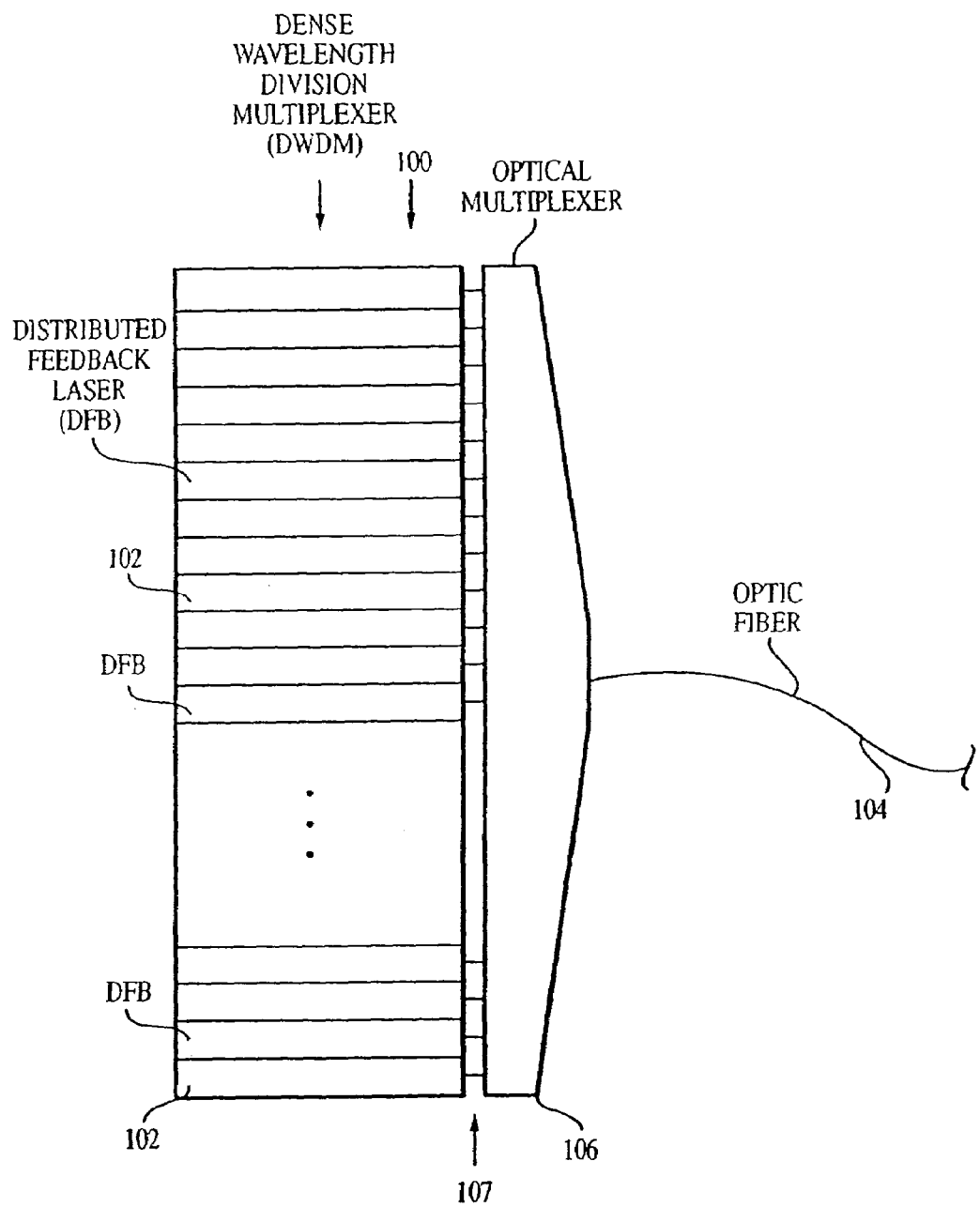
FIG. 1 illustrates a DWDM configured in accordance with the prior art.
Figure 2:
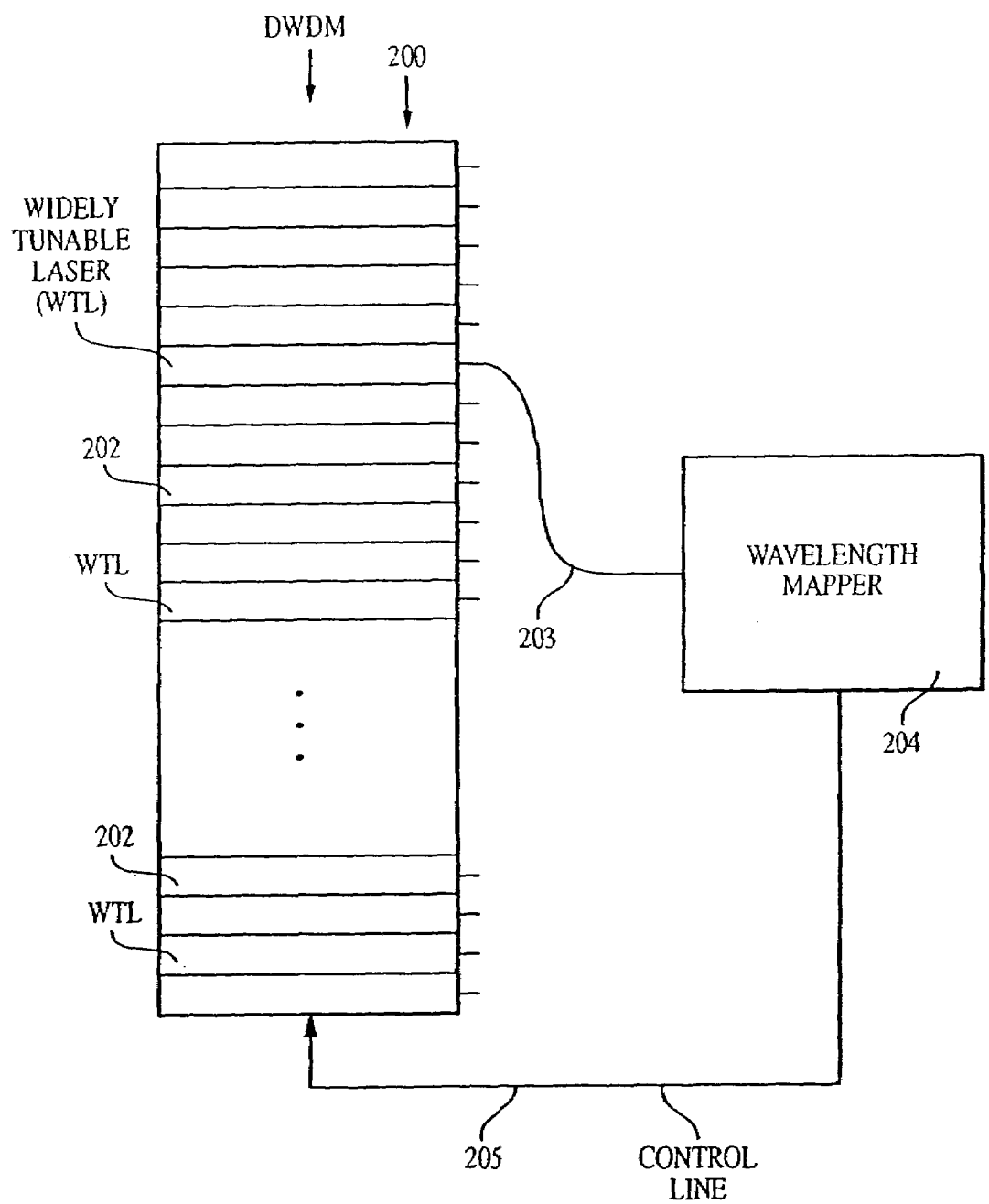
FIG. 2 illustrates a DWDM along with a wavelength mapper provided in accordance with a first exemplary embodiment of the invention, with the wavelength mapper provided for automatically determining the transmission wavelengths of the lasers of the DWDM as a function of tuning parameters of the lasers.

FIG. 2 illustrates a DWDM 200 having forty individual WTLs 202 for transmitting optical signals on forty ITU C-band channels via a single optic fiber (not shown). In FIG. 2, an optic fiber output from a selected WTL is connected via a fiber optic line 203 to the input of wavelength mapper 204 (which may be either integrated into a fixed machine or in a hand-held, portable unit) configured for automatically determining the transmission wavelength of the WTL as a function of WTL tuning parameters, such as a WTL control voltage or current, output from the wavelength mapper to the selected WTL of DWDM via a control line 205. Although a forty channel DWDM is shown, in other implementations 80, 160, or more WTLs are provided. Also, other lasers may be employed in the alternative, such as DFB lasers, provided their tuning range is sufficient to record a minimum number of gas absorption lines ($\geq 5$).

To permit the DWDM to transmit the forty separate ITU channels simultaneously, each individual WTL of the DWDM must be precisely tuned to a single ITU transmission channel wavelength. For an example wherein the WTLs are tuned by applying a control voltage to the WTL, a separate voltage level is associated with each ITU wavelength. The wavelength mapper operates to determine the resulting transmission wavelength for each WTL for values of the control voltage throughout an entire voltage tuning range. This process is performed sequentially for each of the forty WTLs to generate a separate wavelength vs. voltage map for each WTL. Thereafter, any particular WTL can be tuned to any selected transmission wavelength merely by accessing the corresponding wavelength vs. voltage map to determine the appropriate control voltage. Typically, the WTLs are set to selected ITU C-band, S-band, or L-band channels, but can be set to any selected wavelength. Wavelength mapping is performed when a new WTL laser is fabricated and its tuning parameters must be determined, and when an installed WTL must be accurately tuned to another ITU channel in the field by field service personnel.

Figure 3:
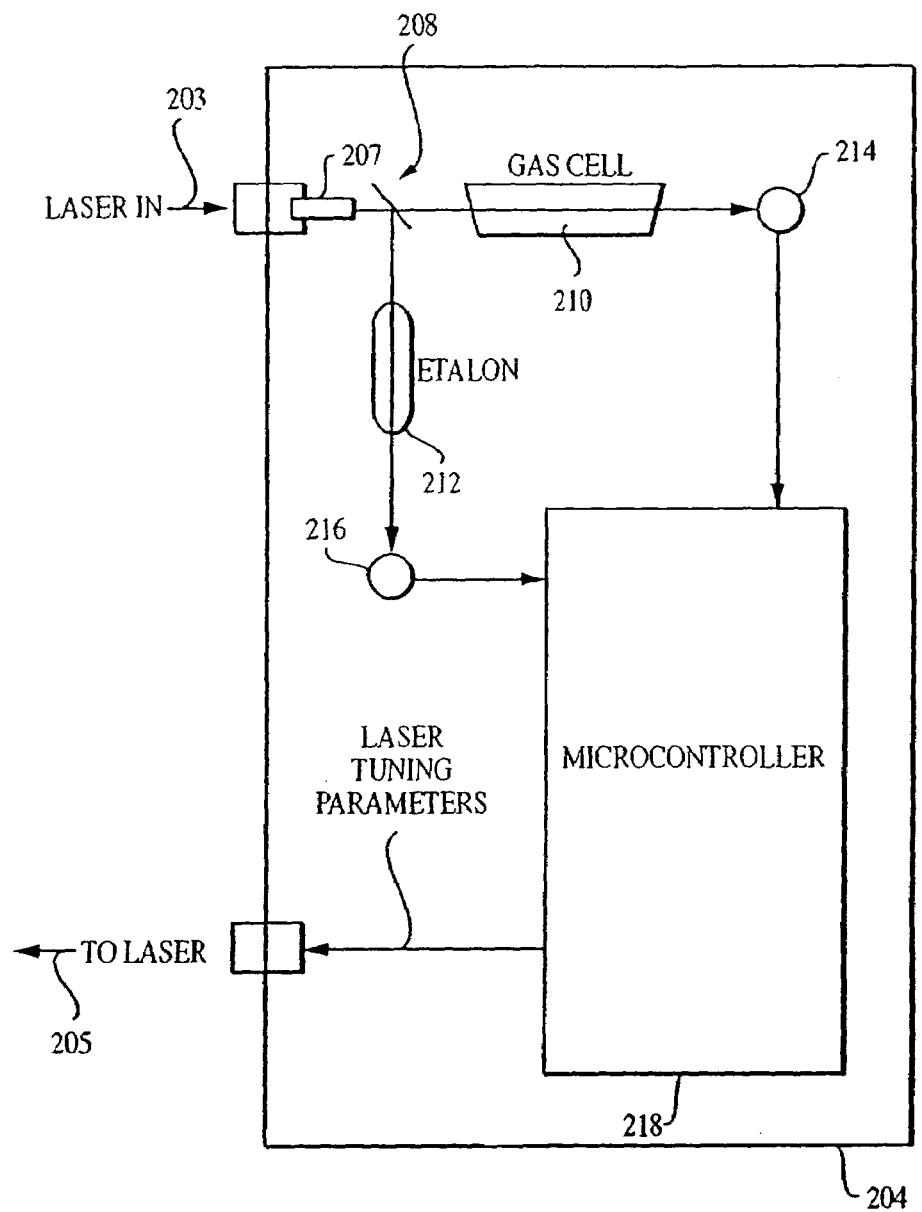
FIG. 3 illustrates the wavelength mapper of FIG. 2.

FIG. 3 illustrates pertinent internal components of wavelength mapper 204. The wavelength mapper receives an input optical beam from one of the WTLs of the DWDM (FIG. 2) via optic fiber 20. The input beam is collimated using a collimator 207 then split using a splitter 208, with one portion of the beam being routed through a gas cell 210 and another portion being routed through an etalon 212. The gas cell contains gas having a known absorption spectrum with numerous absorption lines in the optical bandwidth in which the laser is to be tuned. For a laser to be tuned within the ITU C- and S-bands, acetylene is appropriate (H $^{13}$C N is also appropriate for C-bands), with carbon dioxide being suitable for the L-band. The etalon is configured to provide numerous transmission maxima within the optical bandwidth in which the laser is to be tuned. The etalon, as with all etalons, provides transmission lines (or fringe peaks) equally spaced in terms of wavenumbers. (A wavenumber is 10,000/(wavelength in microns) and thereby can easily be converted to wavelength or frequency). For use with a forty channel ITU C-band DWDM, the etalon is preferably configured to provide at least five hundred transmission peaks in the C-band.

A first optical detector 214 detects a beam emergent from the gas cell and a second optical detector 216 detects a beam emergent from the etalon. Signals detected by the detectors are routed into a microcontroller 218 for processing therein. The microcontroller is also connected to the DWDM via control line 205 to control the selected WTL of the DWDM to scan through the entire ITU C-band. In other words, the microcontroller varies the voltage or current input to the WTL throughout an entire input range to thereby vary the transmission wavelength of the WTL throughout the entire ITU C-band. As a result, the two optical detectors both receive an entire spectrum of optical signals covering the entire ITU C-band. The detector coupled to the etalon detects an etalon spectrum having etalon transmission lines therein. The detector coupled to the gas cell detects a gas absorption spectrum having gas absorption lines therein. The microcontroller also inputs a reference gas absorption spectrum for the gas contained within the gas cell wherein the reference absorption spectrum specifies the absolute wavenumber, wavelength or frequency for each of the absorption lines of the gas. The microcontroller processes the detected etalon and gas absorption spectra in combination with the reference gas spectrum to determine the transmission wavelengths of the WTL as a function of the voltage or current tuning parameter applied to the WTL to thereby map the wavelengths of the WTL. The wavelength map is stored for subsequent use in setting the WTL to transmit at any selected wavelength, such as at one of the ITU C-band channels.

Figure 5:
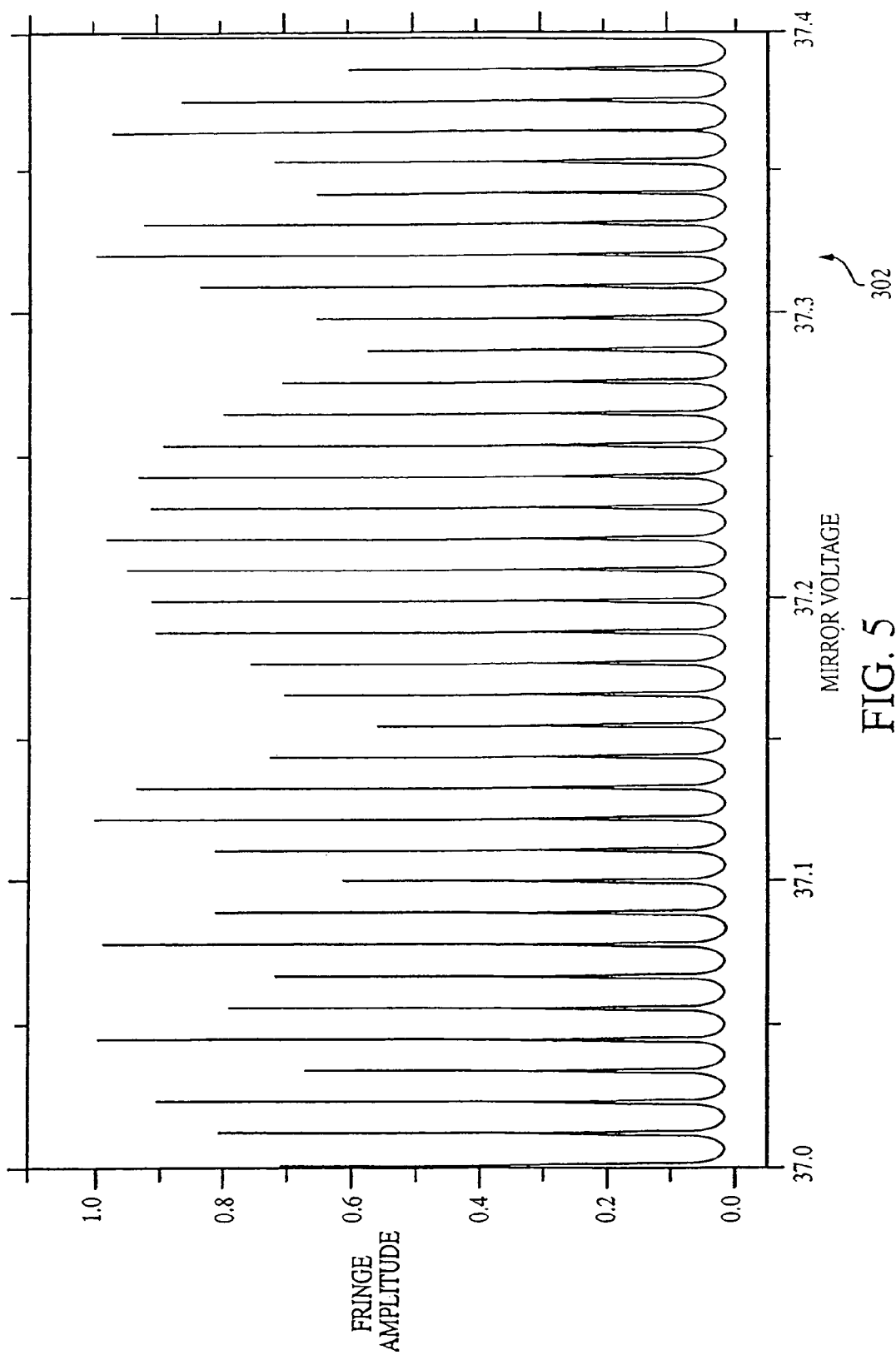
FIG. 5 illustrates an exemplary etalon transmission spectrum detected by the method of FIG. 4, scaled as a function of a laser voltage tuning parameter.
Figure 6:
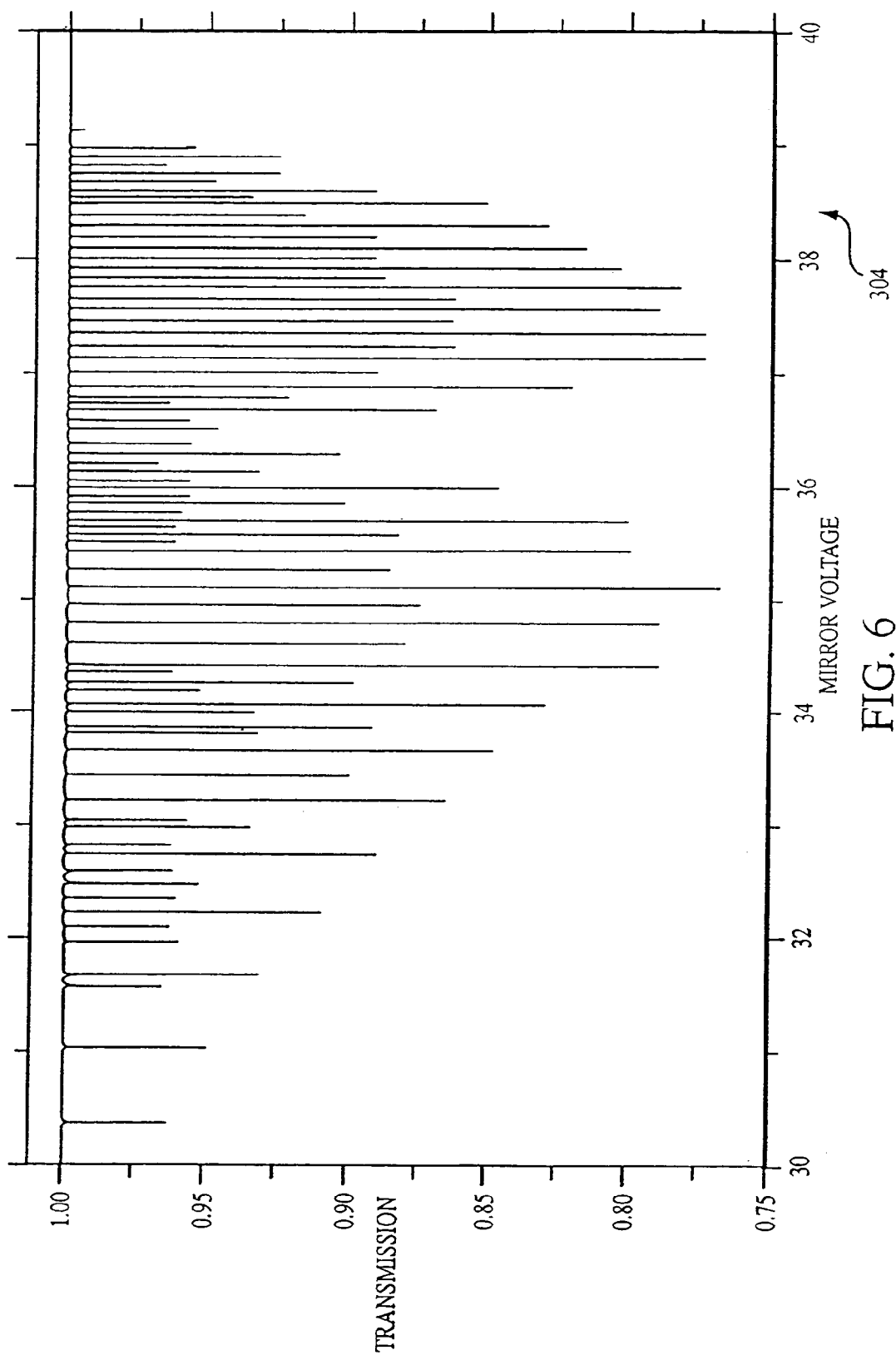
FIG. 6 illustrates an exemplary gas absorption spectrum detected by the method of FIG. 4, also scaled as a function of the laser voltage tuning parameter.

The manner by which the wavelength mapper generates a wavelength vs. tuning parameter map for a WTL or other laser will now be described in greater detail with reference to FIGS. 4–7. Initially, at step 300 of FIG. 4, the wavelength mapper routes an output beam of the laser through the etalon and through the gas call while tuning the laser through a complete range of tuning parameters to generate an etalon transmission spectrum and gas absorption spectrum. In one specific example, for a laser tuned by a control voltage ranging from 0.0 to 40.0 volts, the wavelength mapper incrementally increases the voltage from 0.0 to 40.0 volts by voltage increments of 0.0000610352 volts to generate etalon and gas absorption spectra each with 65536 data points. The etalon and gas absorption spectra are detected at step 306 and stored in separate data arrays by the wavelength mapper. A section of an exemplary etalon spectrum 302 for an etalon having a peak spacing of about 6.6 gigahertz (GHz) is shown in FIG. 5. Preferably, however, an etalon with a peak spacing of about 8 GHz is used. A section of an exemplary gas absorption spectrum 304 for acetylene is shown in FIG. 6. Both spectra are scaled by voltage. For each data point, the wavelength mapper also stores the corresponding data point number in a data array. Hence, the detected etalon and gas absorption spectra are both recorded as functions of voltage, not wavelength or frequency, which is as yet unknown.

Figure 4:
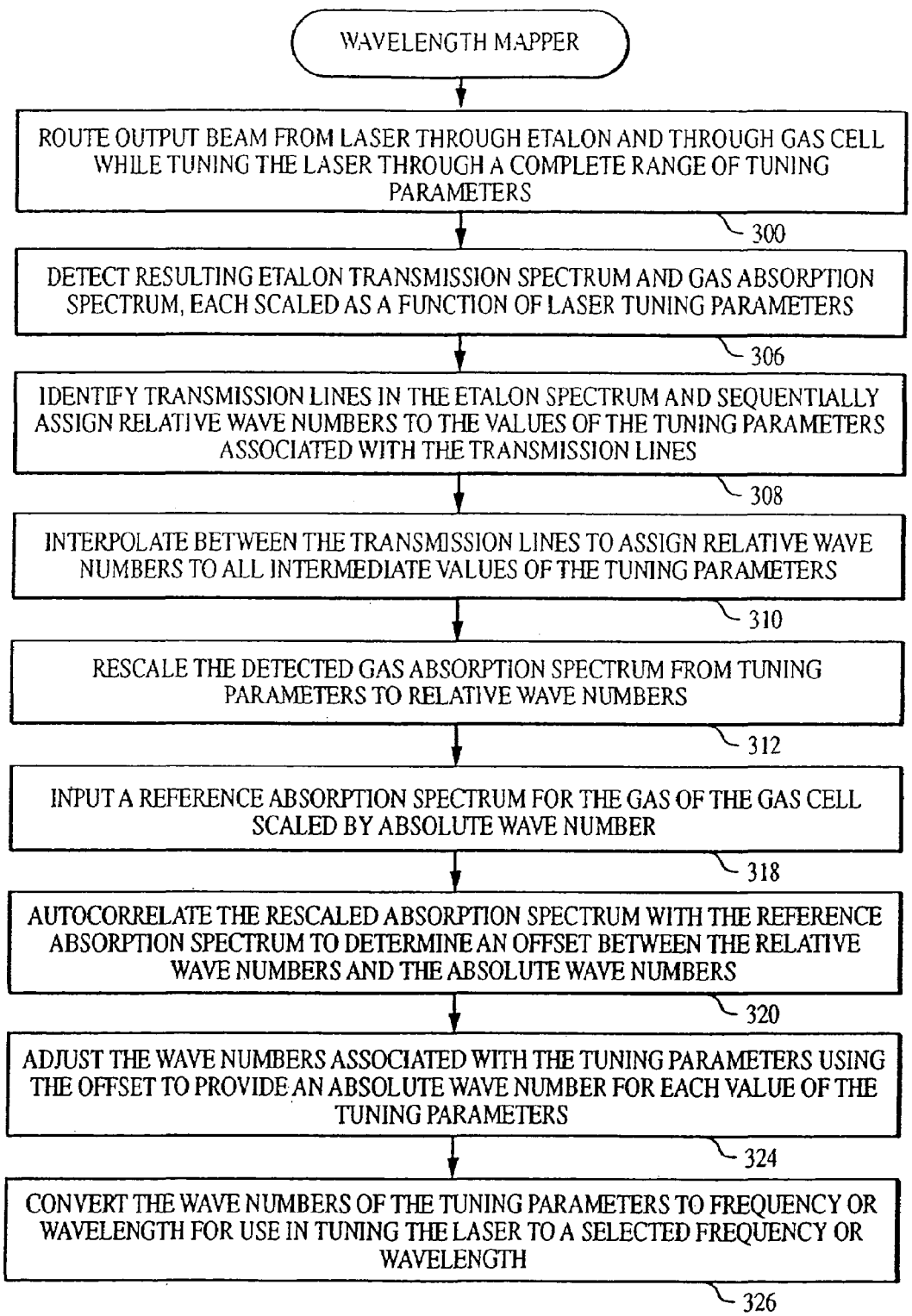
FIG. 4 illustrates a method performed by the wavelength mapper of FIG. 3.

Continuing with FIG. 4, the wavelength mapper then processes the detected etalon spectrum at step 308 to identify and locate transmission peaks therein. The peaks are located by determining first and second derivatives of the etalon spectrum as a function of data point and by applying polynomial fitting in the local peak areas in accordance with conventional techniques. The location of each peak is specified by its corresponding fractional data point number. Note that the peaks are not equally spaced in terms of the data points. Rather, the peaks are generally non-linearly distributed among the data points. In any case, once the peaks are identified and located, the wavelength mapper sequentially assigns relative wavenumbers to each of the transmission peaks beginning with 1 and proceeding to the last detected peak. In the example of FIG. 5 (which shows only a very small section of the etalon spectrum), there are 37 peaks and hence the peaks may be numbered from e.g. 400 to 437. The relative wavenumbers generated by this process are stored in the etalon spectrum data array at the fractional data point corresponding to the voltage peak, and interpolated to the integer point numbers surrounding the peak. For example, if the 403rd transmission peak is found at data point 50788.56 out of the 65536 data points, then relative wavenumber 403 is assigned to fractional data point 50788.56. Relative wavenumbers for integer data points 50788 and 50789 are obtained by interpolation and stored in the etalon data array. Similarly, if the 404th transmission peak is found at data point 50823.17 out of the 65536 data points, then relative wavenumbers 404 is stored in association with fractional data point 50823.17. Fractional relative wavenumbers for the adjacent integer points 50823 and 50824 are assigned by interpolation. The relative wavenumbers can be assigned to the transmission peaks of the etalon spectrum sequentially because the peaks are generated by an optical etalon which, by virtue of its optical properties, produces peaks substantially equally spaced in wavenumber. Hence, even though the peaks are not equally spaced as a function of the data points or as a function of laser input voltage, the peaks are nevertheless equally spaced as a function of relative wavenumber, and sequential wavenumbers can be reliably assigned. The wavenumbers are referred to herein as relative wavenumbers because the absolute wavenumber (and hence the absolute wavelength or wavelength) is not yet known.

Thus, upon completion of step 308, relative wavenumbers have been assigned only to those integer data points in the etalon spectrum array that correspond to the closest etalon transmission peak. At step 310, the wavelength mapper interpolates between the peaks to assign fractional wavenumbers to each intermediate data point. For the example wherein the relative wavenumber 403 falls between data points 50788 and 50789, and relative wavenumber 404 falls between integer data points 50823 and 50824, the wavelength mapper interpolates between the assigned fractional wavenumbers to data points 50789 through 50822. In one specific example, as a result of the interpolation, data point 50789 may be assigned a relative wavenumber of 6471.5600; data point 50790 may be assigned a relative wavenumber of 6471.5625; and so on. In this manner, interpolation is preformed to assign fractional relative wavenumbers to each remaining value in the etalon spectrum data array. Note that the fractional wavenumbers are not necessarily evenly distributed between integer wavenumbers. Rather, as a result of the interpolation, the fractional wavenumbers may be assigned non-linearly. Thus following interpolation, each integer data point of the etalon array has a relative wavenumber associated therewith. The relative wavenumbers are stored along with the corresponding voltage values in the etalon spectrum data array to thereby provide a relative wavenumber for each data point.

At step 312, the relative wavenumbers generated for each data point of the etalon array are used to re-scale the gas spectrum data array. To this end, the relative wavenumber of each data point of the etalon spectrum array is assigned to the corresponding data point of the detected gas absorption spectrum array. At this point a relative wavenumber scale exists both for the etalon transmission spectrum and the gas absorption spectrum. However, the relative wavenumber scale is not linear because of the non-linear tuning properties of the laser.

Figure 7:
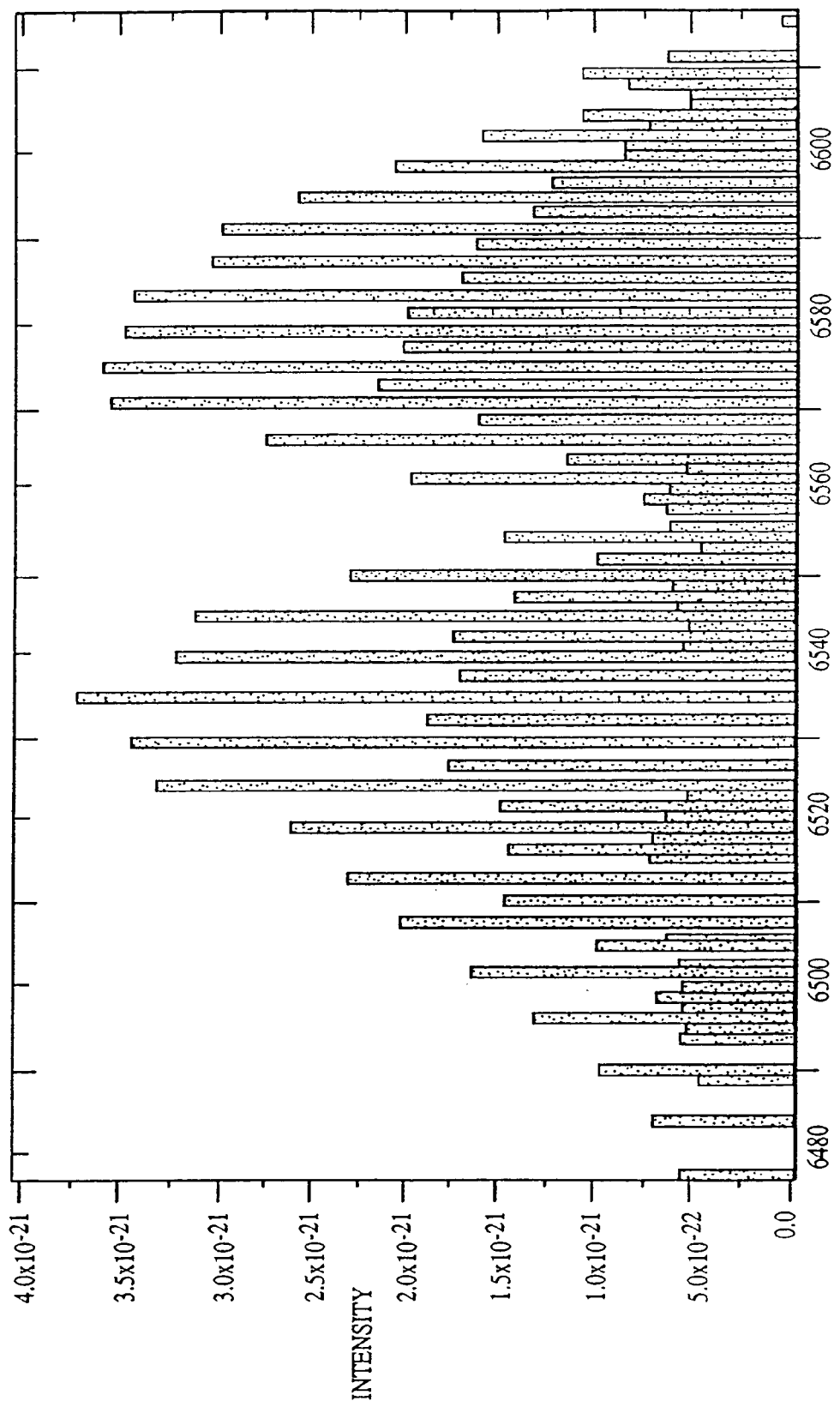
FIG. 7 illustrates an input reference gas absorption spectrum.

At step 318, the wavelength mapper inputs a reference gas absorption intensity spectrum for the gas of the gas cell, wherein the reference spectrum is scaled according to absolute wavenumber, rather than relative wavenumber. FIG. 7 illustrates a portion of an exemplary reference gas intensity spectrum 322 for acetylene. This spectrum is generated synthetically using the know frequencies and intensities of the reference gas, which are known to high accuracy through published laboratory measurements and verification by the National Institute of Standards and Technology (NIST). The reference spectrum is input as a data array of equal size to the modified gas absorption data array, e.g. 65536 data points. At step 320, the wavelength mapper autocorrelates the intensity pattern of the modified detected gas absorption spectrum, which is a function of relative wavenumber, with the intensity pattern of the input reference spectrum, which is a function of absolute wavenumber, to determine any offset therebetween. An appropriate autocorrelation technique, modified as needed, may be found in "Correlation-based Technique for Automated Tunable Diode Laser Scan Stabilization", Randy May, *Rev. Sci. Instrum.* 63 (5), May 1992. As a second iteration of the process, the etalon transmission peak spacing (the etalon "free spectral range", or FSR) is more precisely determined from the known gas spectrum line positions, and the wavenumber mapping process is repeated to improve accuracy.

Thus, following step 318, the wavelength mapper stores the modified detected gas intensity spectrum generated at step 312 and the reference gas intensity spectrum input at step 318. The two spectra are similar but are offset from one another. At step 320, autocorrelation is performed to determine the shift of the spectra with respect to one another until the spectra are aligned, thus permitting the amount of shift or offset to be determined. The offset represents the offset between the relative wavenumbers and their corresponding absolute wavenumbers. At step 324, the relative wavenumbers of the various arrays are adjusted using the offset to convert the relative wavenumbers to absolute wavenumbers. Once the absolute wavenumbers are known, an absolute wavelength or frequency is assigned at step 326 to each of the control voltage values stored in the etalon spectrum array.

Although the wavelength mapper has been described with respect to an exemplary embodiment wherein the laser is controlled by a single voltage control signal, in general, any laser can be used with the invention so long as an appropriate gas absorption reference is available and the laser is tunable via a set of input tuning parameters, such as various combinations of input analog or digital signals. The laser is simply scanned through a range of tuning parameters sufficient to enable determination of the absolute output wavelength of the laser as a function of any combination of the tuning parameters. The resulting wavelength vs. tuning parameters map is therefore a multi-dimensional map having a unique wavelength for each combination of tuning parameters. For some lasers tunable with two parameters, it may be sufficient to set a first tuning parameter to a single constant value while varying a second tuning parameter, then set the second tuning parameter to a single constant value while varying the first tuning parameter. In other cases, it may be necessary to tune the laser through every possible combination of the two parameters to account for non-linear effects. For any given laser, routine experimentation can be performed to determine the specific manner with which the tuning parameters are to be varied.

What has been described thus far is a wavelength mapper that operates to generate a map of wavelength vs. tuning parameters for a laser, particularly one in a DWDM. In the following, a wavelength locker is described which automatically sets the laser to a selected wavelength by using a wavelength map, and then locks the laser wavelength using an etalon transmission peak that has been temperature or voltage tuned to the selected ITU channel. As many of the features of the wavelength locker are the same as the wavelength mapper described above, only pertinent differences will be described in detail.

Wavelength Locking Overview

Figure 8:
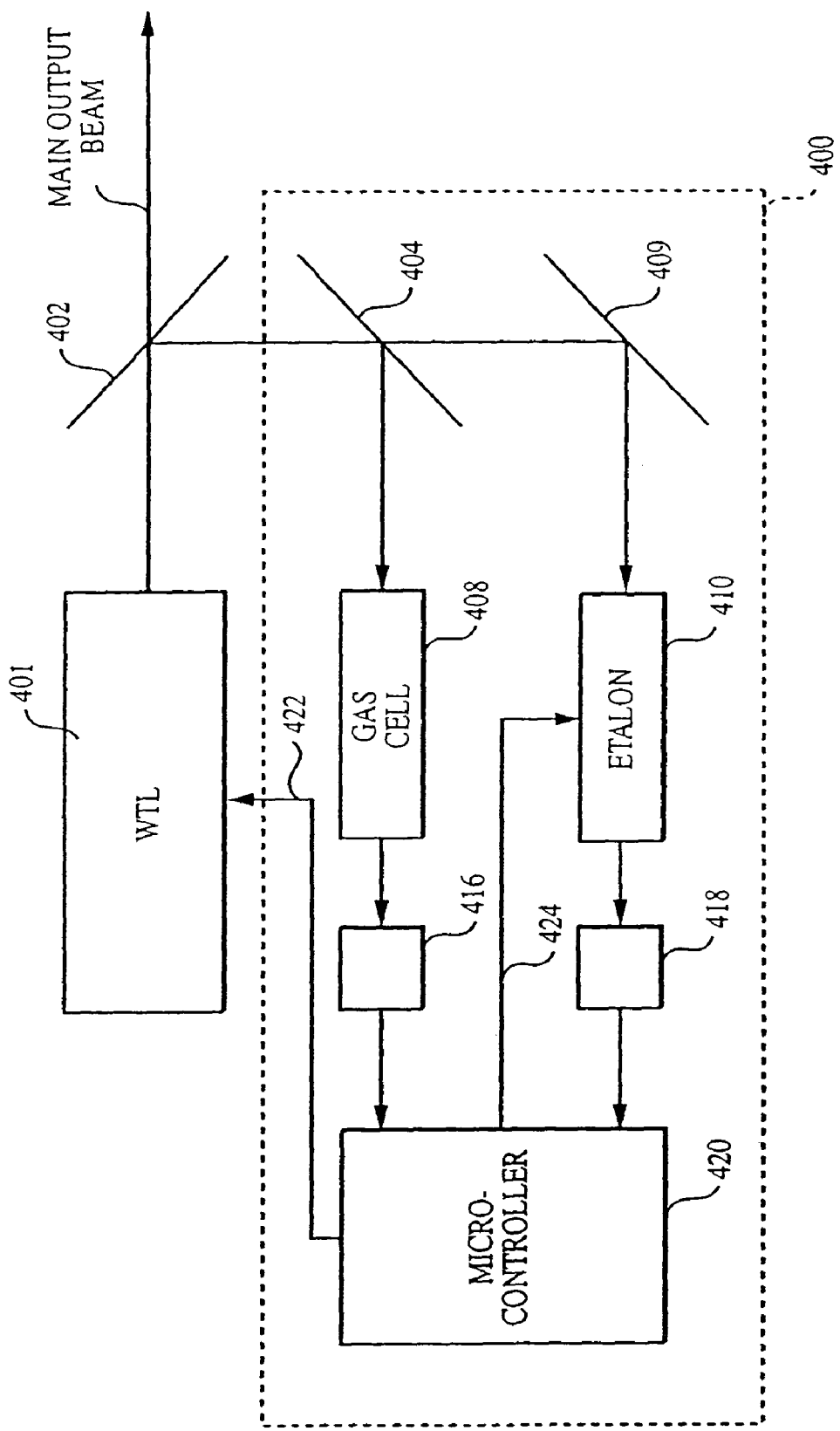
FIG. 8 illustrates an individual DWDM laser along with a wavelength locker provided in accordance with a second exemplary embodiment of the invention, with the wavelength locker provided for automatically locking the wavelength of the laser to a selected ITU transmission wavelength by using a temperature-controlled etalon in a feedback loop.

FIG. 8 illustrates pertinent internal components of a first example of a wavelength locker 400 for use with a WTL 401. The wavelength locker receives the output from WTL 401 via an optical fiber splitter 402. The laser beam input to the wavelength locker is initially of unknown wavelength. Inside the wavelength locker, a second splitter 404 splits the beam in two with one portion routed through a gas cell 408 and the other portion reflected from a mirror 409 and then routed through an etalon 410. Separate detectors 416 and 418 record the transmission spectra of the gas cell and the etalon as with the wavelength mapper. A microcontroller 420 varies control parameters input to the WTL along a control line 422 to generate a spectrum having both etalon transmission peaks and gas absorption lines. The recorded spectra are fed into the microcontroller for processing to generate a wavelength vs. WTL tuning parameter map using the techniques described above. Once the wavelength vs. WTL tuning parameter map has been generated, the microcontroller controls looks up the WTL tuning parameter corresponding to a selected wavelength, such as an ITU channel wavelength, then applies the WTL tuning parameter along control signal along line 422 to tune the WTL to the selected transmission wavelength. Additionally, the microcontroller adjusts a temperature control set point to the etalon via a control line 424 to vary the wavelengths of the transmission peaks of the etalon until one of the transmission peaks, as detected by detector 416, is precisely aligned with the selected output wavelength. The microcontroller then locks the output wavelength of the WTL to the selected wavelength by monitoring the etalon transmission peak that is aligned with the selected wavelength. To this end, the micro-controller detects any drift of the laser output wavelength as detected by detector 418 and adjusts the tuning parameters applied to the WTL via control line 422 to compensate for the drift. In other words, a negative feedback loop is provided which keeps the main output beam locked on a selected transmission channel despite possible variations in the output characteristics of the WTL.

Alternatively, gas cell 408 and etalon 410 are integrated into a single device or are provided along a common optical path with a single detector to detect the etalon and the gas absorption spectra simultaneously. Although the resulting spectra has both etalon peaks and gas absorption lines, the etalon peaks and the gas absorption lines do not significantly interfere with one another and hence the wavelength mapping process performed above can be performed. In this regard, the etalon peaks represent about 30% changes in transmission, whereas the gas lines represent only about 1% using second harmonic detection. Thus, the gas lines represent a very small perturbation to the etalon spectrum and do not interfere with the etalon wavenumber locking procedure, but are strong enough to permit the autocorrelation procedure without significant errors.

Figure 9:
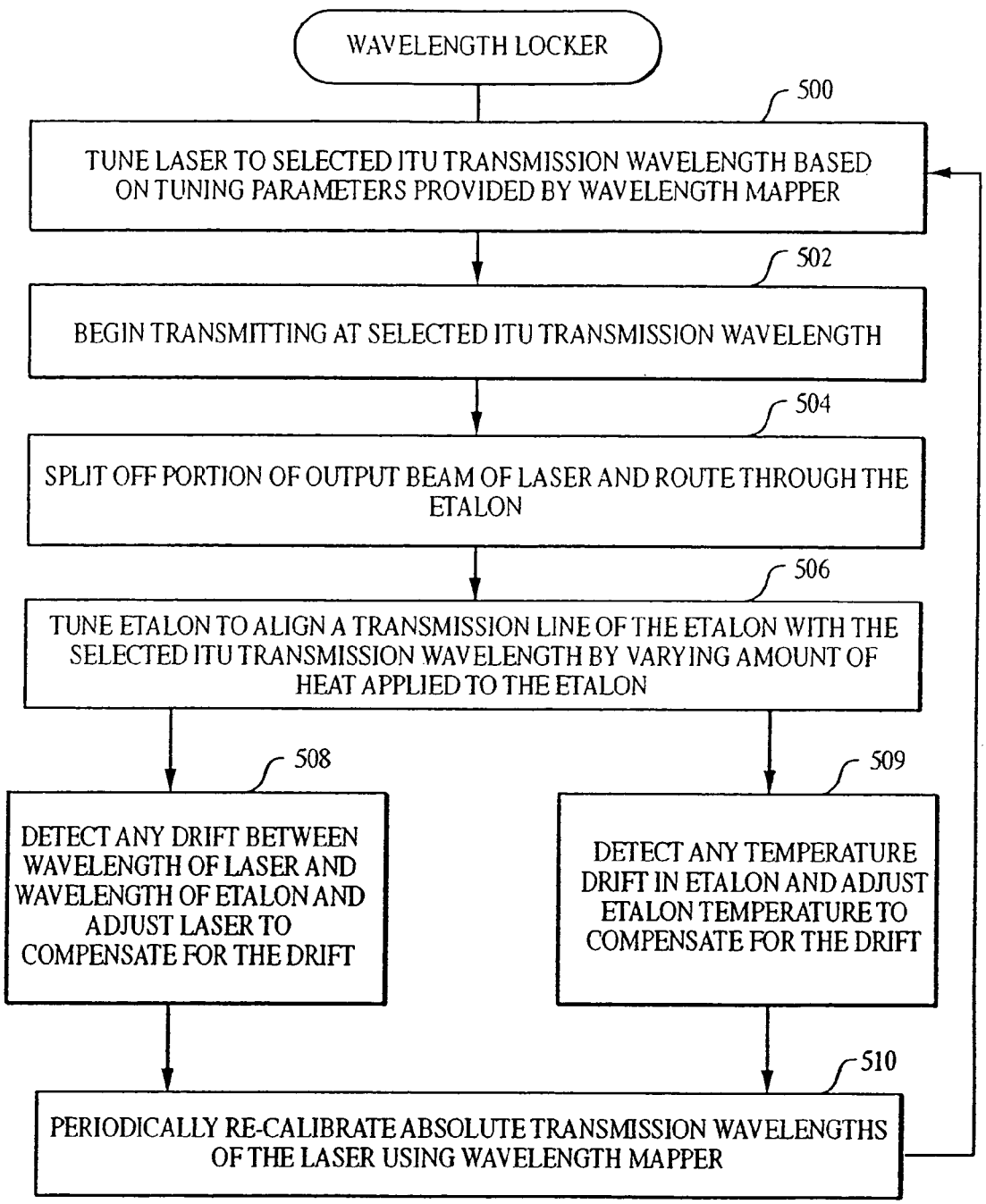
FIG. 9 illustrates a general method for locking the transmission wavelength of a WTL of a DWDM to fixed wavelength using a wavelength locker such as the device of FIG. 8.
Figure 10:
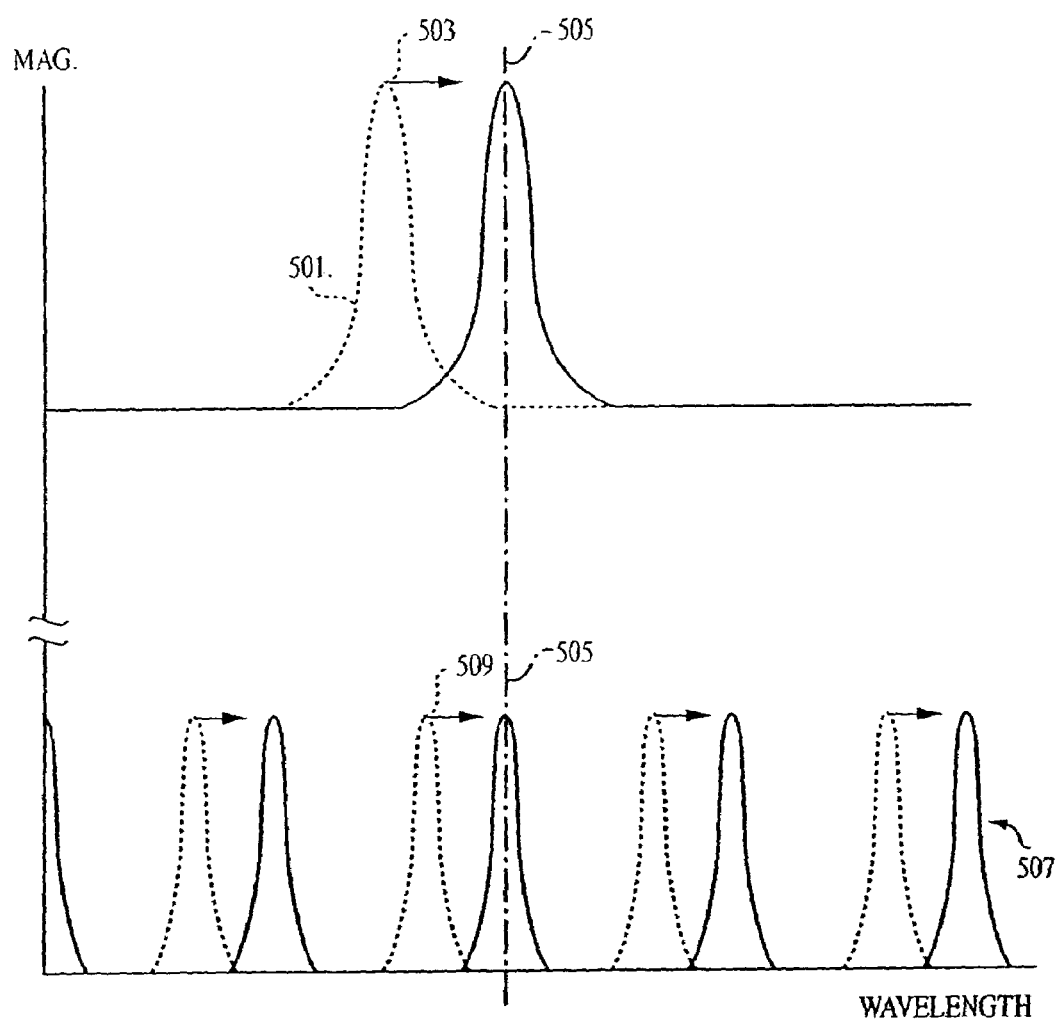
FIG. 10 graphically illustrates a laser transmission beam and a set of etalon transmission lines adjusted using the method of FIG. 9.

The general wavelength locking method of the invention is summarized in FIG. 9. The general method may be performed by the wavelength locker of FIG. 8, by the wavelength lockers of FIGS. 11–16 to be described below, or by any other suitable device. Initially, at step 500 of FIG. 9, a laser (such as a WTL 401 of FIG. 8) is tuned to a selected transmission wavelength. For a WTL of a DWDM, the laser may be set, for example, to the absolute wavelength of one of the channels of the 40-channel ITU C-band transmission protocol. Step 502 is illustrated by FIG. 10, which shows a laser beam 501 being adjusted to move its center wavelength from some initial transmission wavelength 503 to the selected ITU channel wavelength 505. Preferably, tuning is achieved by first performing the wavelength mapping technique described above to map the absolute transmission wavelengths of the laser as a function of tuning parameters to thereby determine the appropriate tuning parameters to apply to the laser to set the laser to the absolute wavelength of the selected transmission channel. But any other suitable tuning technique can be used instead to tune the laser to a selected transmission wavelength. At step 502 of FIG. 9, the laser begins transmitting information signals along an output optic fiber at the selected transmission wavelength. The information signals may include, for example, data, audio or video signals. A portion of the output beam of the laser is split off at step 504 and routed through an etalon (such as etalon 510 of FIG. 8), which splits the beam into a set of interference lines or fringes. At step 506, a microcontroller connected to the etalon adjusts the etalon to align one of the transmission lines with the transmission wavelength of the laser. Step 506 is illustrated in FIG. 10, which shows a set of etalon transmission lines or fringes 507 being adjusted until the center wavelength 509 of one of the etalon transmission peaks is aligned with the wavelength of the laser at the selected ITU channel wavelength 505. To this end, the portion of the beam split off from the main output beam of the laser can be split again, as shown in FIG. 8, into two separate beams, one passing through the etalon to a first detector and the other passing to a second detector, either directly or through a gas absorption chamber. The microcontroller receives signals from both detectors and adjusts the temperature of the etalon until a transmission peak of the etalon is obtained with the desired ITU channel (wavelength). This technique suffices to place the etalon transmission line at the absolute wavelength of the selected ITU transmission channel since the laser has already been set, at step 500, to transmit at the selected absolute wavelength and insufficient time has elapsed for the wavelength of the laser to drift from that absolute wavelength.

Hence, following step 506, both the laser and the etalon have been adjusted to emit beams at the ITU channel wavelength and therefore both the first and second detectors receive signals at the same wavelength. At step 508, any wavelength drift between the beams detected by the first and second detectors is identified and the laser is automatically adjusted by the microcontroller to compensate for the drift. To this end, the tuning parameters applied to the laser are adjusted as needed to lengthen or shorten the transmission wavelength of the laser to keep the transmission wavelength of the laser, as detected by the second detector, aligned with the transmission line of the etalon, as detected by the first detector. In this manner, the laser is kept locked on the absolute wavelength of the selected ITU channel. Routine wavelength locking feedback techniques may be employed to ensure reliable wavelength locking. Simultaneously, at step 509, any drift in the temperature of the etalon is detected and the temperature of the etalon is automatically adjusted by the microcontroller to compensate for the drift. Temperature detectors are mounted to the etalon and routine feedback techniques are employed to keep the temperature of the etalon fixed.

The wavelength-locking technique of FIG. 9 is effective, in part, because the etalon is more stable than the laser and hence it can be assumed that any short-term drift is caused by a variation in the output wavelength of the laser and not by drift in the transmission wavelengths of the etalon. Eventually, the transmission lines of the etalon may begin to drift despite the precise temperature control of the etalon. Hence, periodically, the system is recalibrated at step 510 by using the wavelength mapper to again tune the laser to the absolute wavelength of the selected transmission channel. As described above, wavelength mapping employs a gas absorption chamber providing absorption lines at known absolute wavelengths that remain fixed despite changes in temperature, pressure etc. After recalibration, the steps of FIG. 9 are repeated to again align one of the transmission lines of the etalon with the transmission wavelength of the laser and to then lock the laser to the etalon transmission line. Recalibration may be performed, for example, once every week or month depending upon the needs of the specific system. In this regard, routine experiments are performed prior to installation of the system to determine the stability of the transmission lines of the etalon and then the system is re-calibrated as often as needed to ensure that no significant drift occurs in the etalon. The system may be implemented with both the wavelength locker and wavelength mapper such that recalibration can be performed as frequently as needed. Alternatively, an external mapper, such as the wavelength mapper described above is employed.

Wavelength Mapper/Lockers

Figure 11:
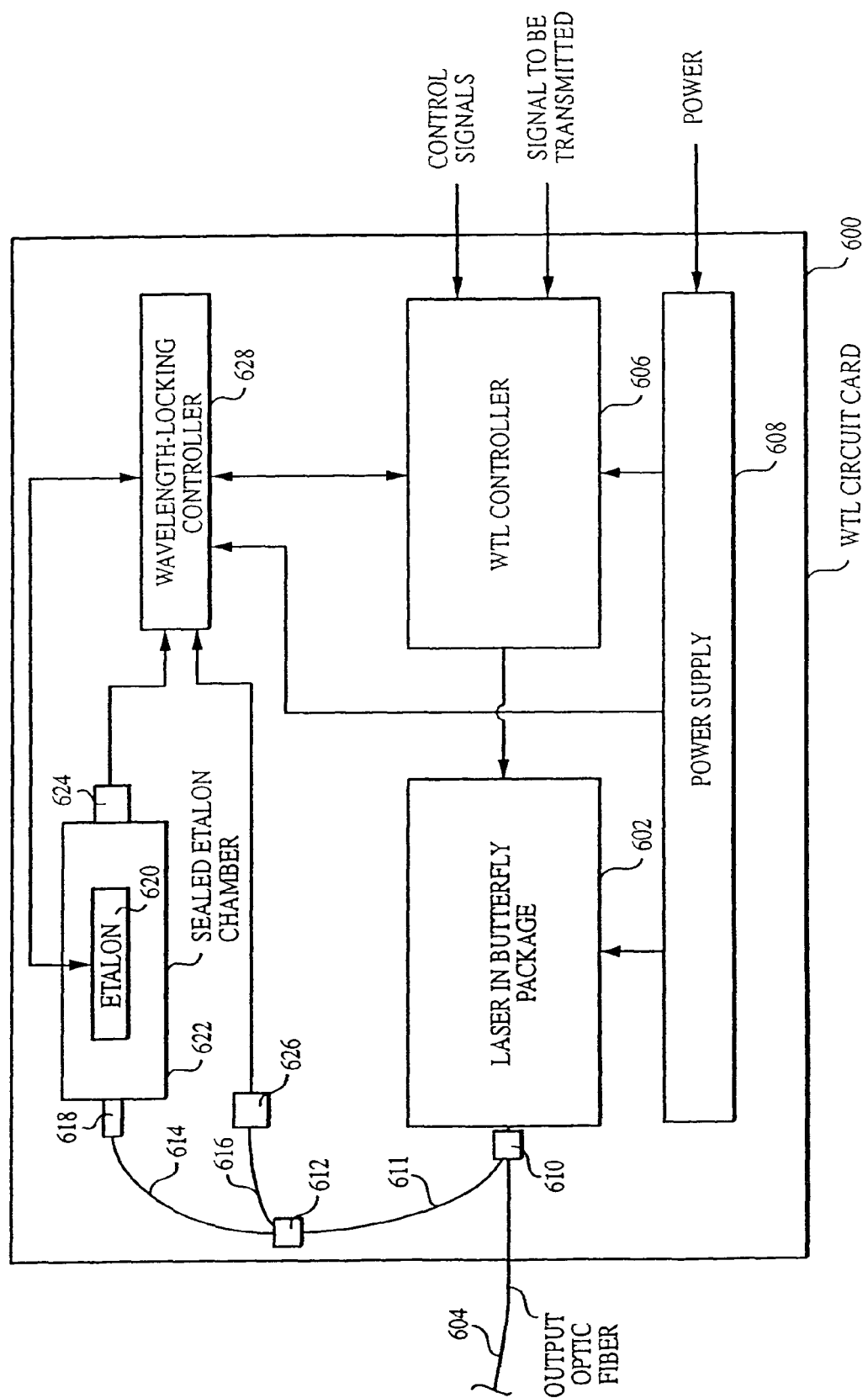
FIG. 11 illustrates a first exemplary embodiment of a WTL circuit card for use in a DWDM wherein the card has a laser mounted within a butterfly package and a wavelength locker having a temperature-controlled etalon for use in locking the laser to an ITU channel wavelength using the method of FIG. 9.

Various specific implementations will now be described with respect to FIGS. 11–16. FIG. 11 illustrates a WTL circuit board card 600 for insertion into a DWDM chassis. Typically, one card is provided per transmission channel of the DWDM. Hence, a forty channel DWDM includes forty of the circuit cards, mounted in parallel. WTL card 600 has a transmission laser mounted within a conventional butterfly package 602 for transmitting a modulated output beam via an output optic fiber 604. The output beam of the fiber 604 is merged with beams from other WTL cards of the DWDM via a multiplexer for eventual transmission via a single optic fiber to a remote DWDM receiver. Digital signals to be transmitted via the output beam and control signals specifying the transmission wavelength to be used are received by a WTL controller 606, which tunes the laser of butterfly package 602 to the transmission wavelength and then controls a signal modulator of the butterfly package to modulate the signal on the output beam. To tune the laser to the selected transmission wavelength, the WTL employs a wavelength map stored in an internal memory (not separately shown), which specifies the tuning parameters (i.e. the control voltage) to apply to the laser to achieve the selected transmission wavelength. The wavelength map is initially generated by a portable wavelength mapper of the type described above and transferred to the WTL controller memory. The WTL controller accesses the stored wavelength map to lookup the tuning parameters based on the input transmission wavelength. Alternatively, the WTL controller directly receives the appropriate tuning parameters via the input control signal and hence need not store the wavelength map. The butterfly package and its internal components can be entirely conventional and will not be described in detail herein. In FIG. 11, the butterfly package is shown in block diagram form with a single input control line from the WTL controller and a single input power line from a power supply 608. In actuality, the butterfly package has numerous pins for receiving control signals from the controller and power from the power supply. The power supply also supplies power to the two microcontrollers of the circuit card.

To provide wavelength locking, a portion of the output beam from the laser is split from optic fiber 604 by a splitter 610 onto another optic fiber 611, then split again by splitter 612 onto optic fibers 614 and 616. Fiber 616 is coupled to a collimator 618, which directs a collimated beam through a temperature-controlled etalon 620 mounted within a sealed chamber 622. The etalon splits the beam into a set of transmission lines or fringes that are detected by a detector 624. Fiber 618 is coupled directly to a second detector 626. A wavelength-locking controller 628 receives signals from the two detectors and, using the method described above, adjusts the etalon to align one of the transmission lines to have the same wavelength as the output beam, then controls the laser (via controller 606) in a feedback loop to lock the laser to the etalon line. To adjust the etalon, the wavelength-locking controller controls an amount of current applied to resistive heating elements coupled to the etalon so as to adjust the temperature of the etalon and thereby adjust its length and index of refraction and hence adjust the wavelength maxima where transmission lines or fringes are generated by the etalon. Once the etalon has been adjusted to align a transmission line to the selected ITU channel, the wavelength-locking controller thereafter keeps the temperature of the etalon fixed so that the wavelength of the transmission line of the etalon does not drift. To control the laser, the wavelength-locking controller transmits control signals to the WTL controller, which cause the WTL controller to increase or decrease the control voltage applied to the laser of the butterfly package so as to adjust the wavelength of the output beam of the laser. The control signals provided by the wavelength-locking controller override those previously received by the WTL controller. Eventually, the components of the circuit card is recalibrated using the portable wavelength mapper to provide a new wavelength map for storage within the WTL controller or to provide new control signals so that any drift in the etalon can be compensated.

Figure 12:
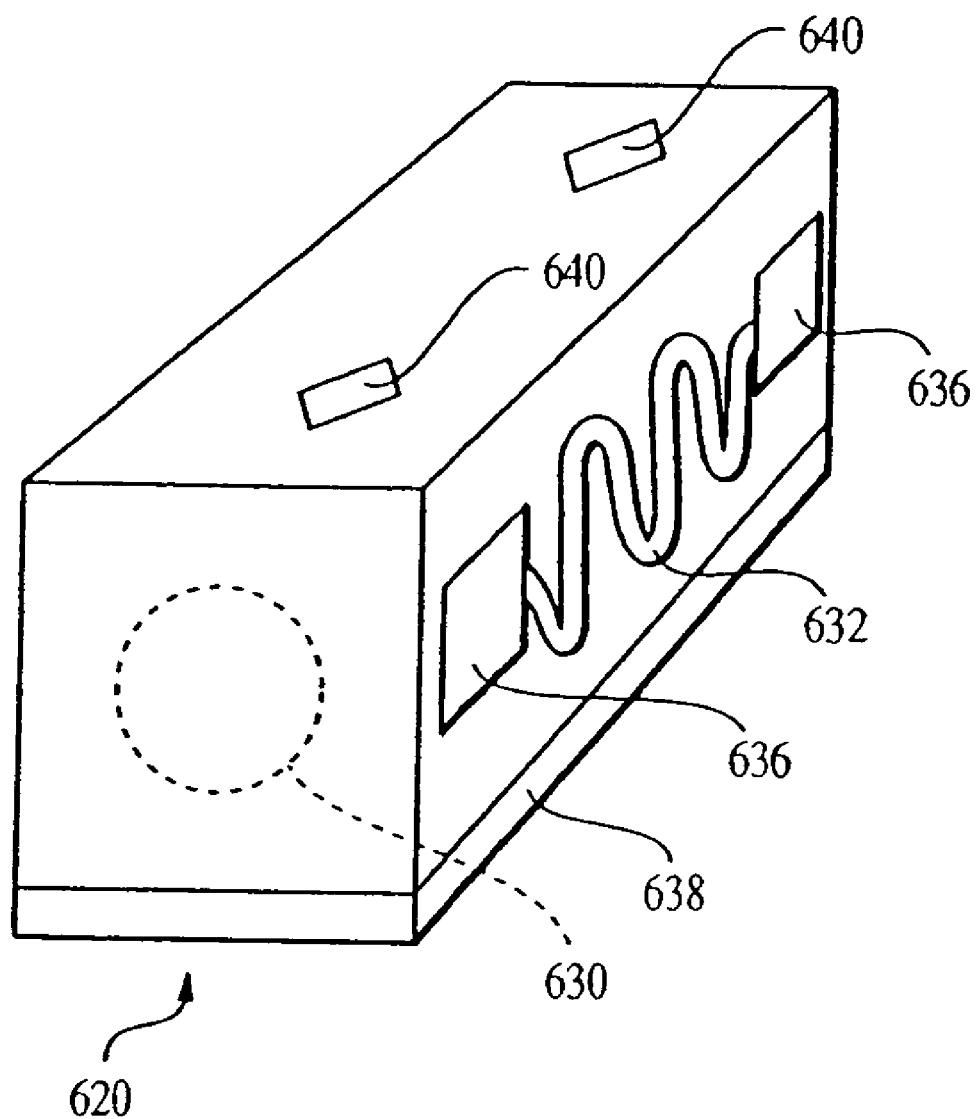
FIG. 12 is a perspective view of the temperature-controlled etalon of the wavelength locker of FIG. 11.

Etalon 620 is shown in FIG. 12. The etalon is a rectangular block formed of silicon and having an optical axis length of about 5.36 mm and a cross-section of about 3 mm by 3 mm and anti-reflection coatings on both faces providing up to 90% reflection at the desired wavelength range. The etalon thereby accommodates a beam width (shown in phantom lines and identified by reference numeral 630) of up to 3 mm. However, it is preferred that the laser beam to be passed through the etalon be collimated to have a width of about 1 mm such that, if the side edges of etalon are not precisely formed, edges of the beam will not be affected. The etalon has finesse in the range of 15 to 30 and preferably about 20 and provides a free spectral range in the range of 6 to 12 and preferably about 8 GHz. Finesse relates to the precision of the individual transmission lines 507 (FIG. 10) generated by the etalon and depends primarily on the reflection coatings, and beam quality. If the finesse is too poor then it is difficult to achieve precise wavelength locking. Free spectral range relates to the wavelength spacing between adjacent transmission lines and depends primarily on the length of the etalon and its index of refraction. If the free spectral range is too great, then it may be necessary to heat or cool the etalon substantially to adjust one of the transmission lines until it is aligned with the selected transmission wavelength and hence power consumption is not minimized. Also, the etalon may need to be heated by an amount that will place the temperature of the etalon outside of an acceptable operational temperature range of the entire device, such as above a mandated maximum temperature of 75 degrees C. for the entire circuit card. If the free spectral range is too small then there is a risk that the wavelength locker may lock the transmission wavelength of the laser to the wrong etalon transmission line, i.e. frequency hopping may occur. The finesse of 20 and the free spectral range of 100 GHz for the 40 channel protocol; 50 GHz for the 80 channel protocol; 25 GHz for the 160 channel protocol; 12.5 GHz for the 320 channel protocol; and 6.25 GHz for the 640 channel protocol are preferred parameters because, with these parameters, the etalon can be used to lock the wavelength of the laser to within a precision of about 0.2 GHz with minimal risk of frequency hopping and with minimal power consumption while permitting the etalon to operate at over 75 degrees C. By achieving a precision of 0.2 GHz, the wavelength locker can be used with all ITU transmission protocols from 40 channels up to 1000 channels or more and can be used with all ITU transmission rates from 2.5 GHz to 100 GHz. Although a finesse of 20 and a free spectral range of 8 GHz are preferred, the etalon may also be configured to have other specific combinations of parameters depending upon the needs of particular systems. Also, the etalon can alternatively be made of other materials such as sapphire or indium phosphide, with the etalon configured as needed to achieve a desired finesse and free spectral range.

Two resistive heating elements 632 and 634 (not shown) made of nickel chromium are vapor deposited or mounted on opposing sides of the etalon. Each resistive heating element has a pair of gold contacts 636 on opposing ends thereof for coupling to electrical leads (not shown) from the wavelength-locking controller 628 (FIG. 11). It will be appreciated that numerous heating techniques may be incorporated into the current invention such that devices provided heating are coupled to the etalon. The etalon is selectively heated by the wavelength-locking controller by applying current through the resistive leads by an amount sufficient to expand or contract the optical axis of the etalon to change its index of refraction and to align one of the transmission lines of the etalon with the selected ITU channel. With the parameters mentioned above, any C-band ITU channel can be accommodated by adjusting the temperature of the etalon in the range of approximately 72±2 degrees C. No TE cooler or other cooling components are required. Rather, cooling is achieved by allowing the etalon to slowly lose heat to the ambient environment. In the alternative, rather than using resistive heating elements to vary the length of the entire etalon, a reflective micro-electrical mechanical system (MEMS) membrane may be mounted to an end of the etalon and coupled to the wavelength-locking controller to permit the controller to adjust an optical reflecting path of the etalon to thereby adjust the wavelengths of the transmission lines of the etalon.

To prevent the temperature-controlled etalon from losing heat too quickly, and to thereby minimize power losses and ensure temperature stability, the etalon is mounted within an airtight chamber (622 of FIG. 11) and is affixed to a base of the chamber by a bonding material 638 having insulating microspheres. By sealing the etalon in the airtight chamber, heat losses due to circulating air are minimized. The chamber may be filled with air or any other gas that provides a relatively low thermal conductivity and is substantially non-reactive and therefore does not corrode the etalon and its components. Another suitable gas is krypton gas. Air is preferred in the embodiment of FIG. 12 as it provides adequate thermal conductivity and is inexpensive to use. By mounting the etalon using a bonding material employing insulating microspheres, heat loss via conduction into the base of the chamber is minimized. This is particularly important because heat loss to the chamber base could result in a temperature gradient within the etalon, i.e. the bottom of the etalon could be cooler that the top. Any temperature gradient within the etalon decreases the finesse of the etalon and thereby can make it more difficult to precisely align a transmission line of the etalon with a selected ITU channel. A preferred bonding material is described in U.S. Pat. No. 4,888,634 to Lai, et al., issued Dec. 19, 1989 and entitled "High Thermal Resistance Bonding Material And Semiconductor Structures Using Same", which is incorporated by reference herein. The bonding material of U.S. Pat. No. 4,888,634 includes a binder and a high thermal resistance material in the form of sieved particles of generally uniform size. The binder is silicone, epoxy or polyimide and the high thermal resistance material is formed of glass microspheres, glass beads, ceramic microspheres, or ceramic beads.

A uniform temperature in the etalon is also facilitated by ensuring that the resistive heating elements cover a substantial portion of the opposing sides of the etalon. The heating elements are offset slightly from top and bottom edges of the etalon to ensure proper and uniform contact with the etalon even if the edges of the etalon are not precisely formed. Once the etalon has been heated so as to align one of the transmission lines of the etalon with the selected ITU transmission wavelength, the wavelength-locking controller keeps the transmission line aligned by detecting the temperature of the etalon using one or more temperature detectors 640 and adjusting the current applied to the etalon as needed to keep the temperature constant. Eventually, as noted above, the transmission line of the etalon may nevertheless drift and hence the aforementioned periodic recalibration is performed.

Thus, FIGS. 11–12 illustrates one exemplary embodiment of the WTL circuit card of the invention. Various other exemplary embodiments will now be described with reference to FIGS. 13–16. The embodiments of FIGS. 13–16 are similar to that of FIGS. 11 and 12 and only pertinent difference will be described.

Figure 13:
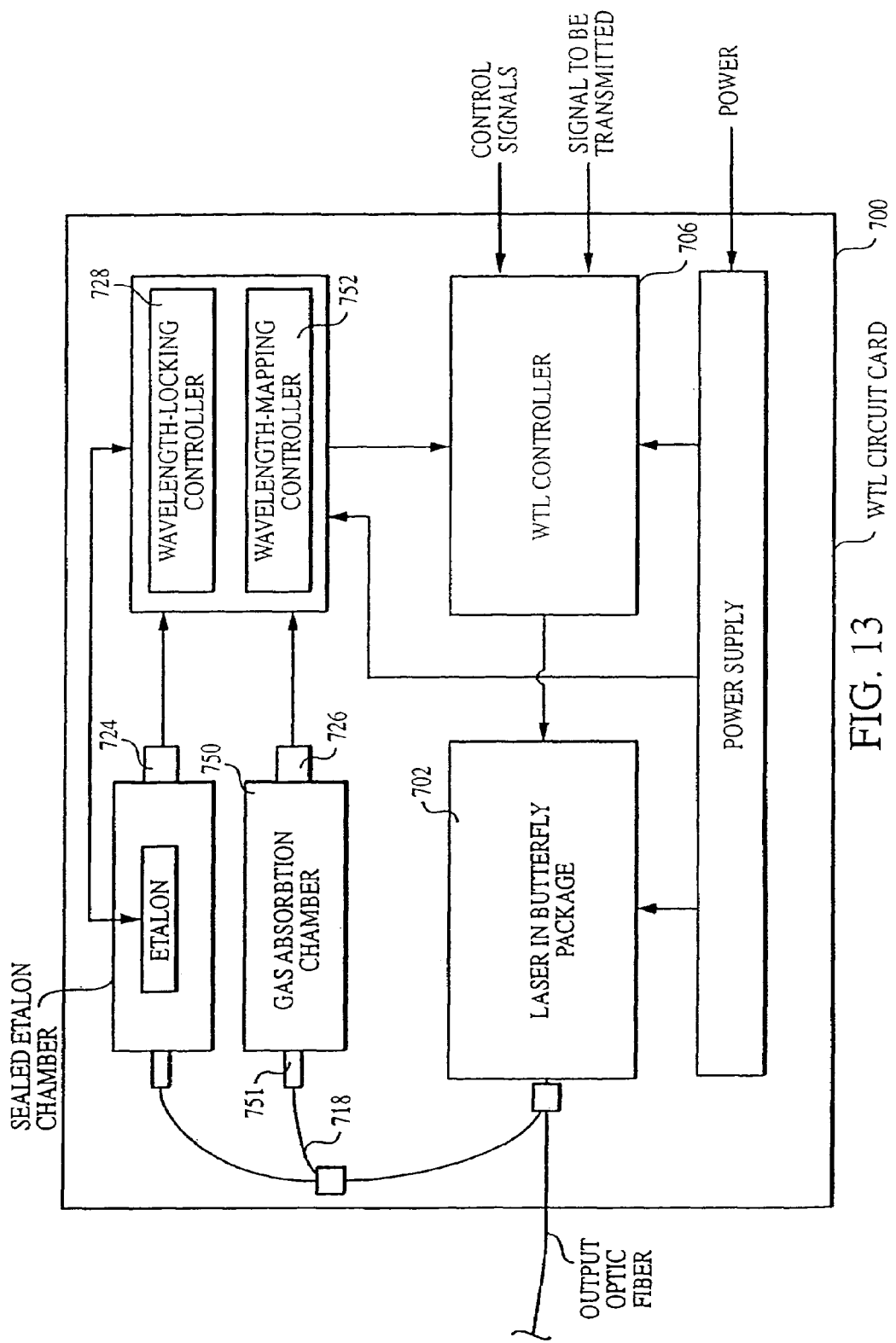
FIG. 13 illustrates a second exemplary embodiment of the WTL circuit card wherein, in addition to the wavelength locker, the card also has a wavelength mapper with a gas absorption chamber for use in mapping the laser to determine absolute transmission wavelengths of the laser prior to wavelength locking.

FIG. 13 illustrates a WTL circuit card 700 that includes both wavelength-locking components and wavelength-mapping components. The wavelength-mapping components include a gas absorption chamber 750 containing a gas of known absorption characteristics such as acetylene, hydrogen cyanide or carbon dioxide. The gas absorption chamber is mounted between optic fiber 718 and detector 726. A collimator 751 is provided at the end of fiber 718 for collimating a beam received from fiber 718 and directing the beam passed through the gas absorption chamber. Hence, a portion of the output beam of the laser of butterfly package 702 is passed through the gas absorption chamber. A wavelength-mapping controller 752 receives signals from both detector 726 and detector 724 and, using the wavelength-mapping techniques described above, maps the absolute transmission wavelengths of the laser by determining the laser tuning parameters associated with each absolute transmission wavelength of the laser, at least within a tuning range of interest, for storage within the WTL controller 706. Thereafter, upon receipt of a control signal specifying an ITU channel for transmission, the WTL controller looks up the tuning parameters and controls the laser to transmit signals on the ITU channel. The wavelength-locking controller 728 operates to keep the laser locked on the ITU channel. Periodically, wavelength-mapping is performed to recalibrate the system. By providing wavelength-mapping components along with wavelength-locking components, re-calibration can be performed as often as desired.

Note that, in the embodiment of FIG. 13, detector 726 is used to detect the gas absorption spectrum for wavelength-mapping purposes and also to detect the laser beam for wavelength-locking purposes. When performing wavelength mapping the wavelength of the laser is tuned through its full range of tuning parameters to generate the gas absorption spectrum. When performing wavelength locking, the wavelength of the laser remains substantially fixed, subject only to minor drift, which is compensated for by the wavelength-locking components. Hence, during wavelength-locking, the gas of the gas absorption chamber may absorb a portion of the light of the laser beam at the wavelength the laser is being locked to. This is not typically a problem because the gas only absorbs a portion of the beam, leaving a sufficient portion for detection to permit wavelength locking. If desired, three detectors may be provided: one for the etalon, one for the gas absorption chamber, and one for directly receiving a portion of the output beam of the laser, so that wavelength locking may be performed without using the beam passed through the gas absorption chamber.

Figure 14:
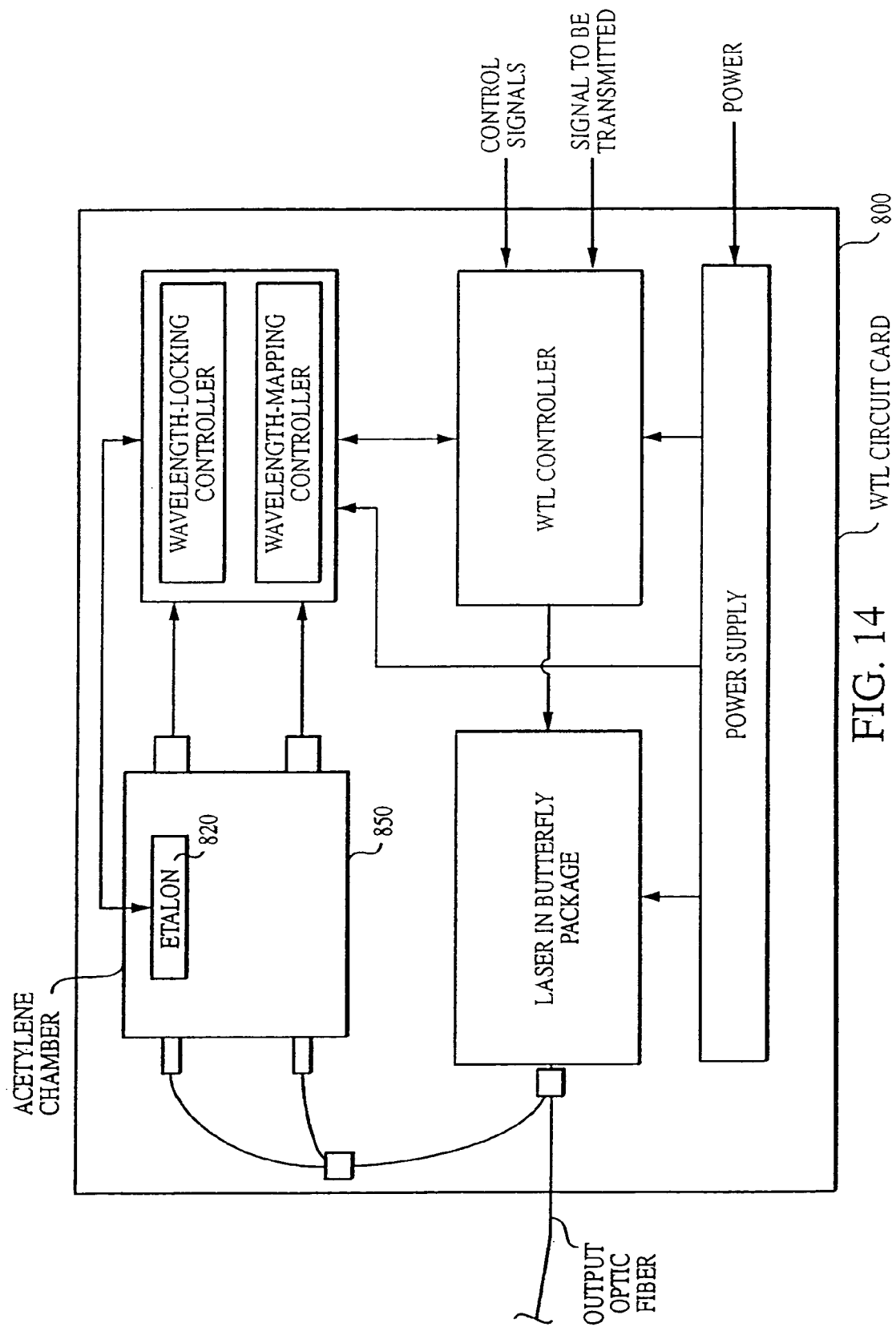
FIG. 14 illustrates a third exemplary embodiment of the WTL circuit card wherein etalon of the wavelength locker is mounted within the gas absorption chamber of the wavelength mapper.

FIG. 14 illustrates another WTL circuit card 800 having both wavelength locking components and wavelength mapping components, but wherein an etalon 820 is mounted within a gas absorption chamber 850 such that separate chambers need not be provided for the etalon and the absorption chamber. The gas absorption chamber contains acetylene, with the acetylene acting both as an absorptive gas for wavelength-mapping purposes and as an insulating gas for the purposes of reducing heat loss from the etalon. The WTL circuit card is operated in the same manner as the circuit card of FIG. 13 to provide both wavelength-mapping and wavelength-locking. By mounting the etalon within the gas absorption chamber, overall device size can be reduced.

Figure 15:
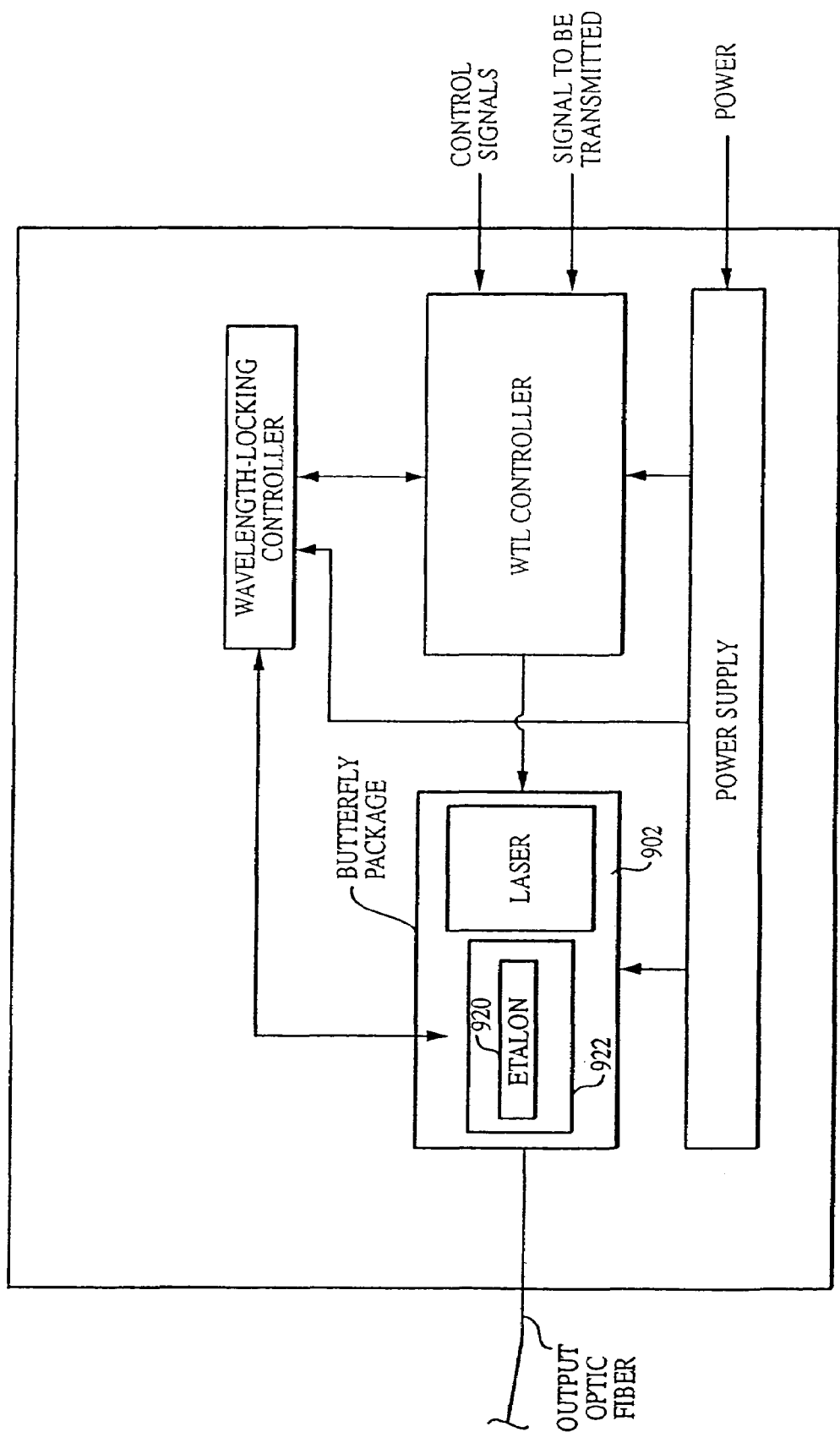
FIG. 15 illustrates a fourth exemplary embodiment of the WTL circuit card wherein an etalon chamber is mounted within the butterfly package along with the laser for use in wavelength locking the laser.

FIG. 15 illustrates a WTL circuit card 900 having wavelength locking components wherein the etalon 920 and its sealed chamber 922 are mounted inside the butterfly package 902. Conventional butterfly packages typically have sufficient unoccupied interior volume to accommodate an etalon of the size described above. If needed, the butterfly package can be made larger to accommodate the etalon chamber. If so, the conventional pin out arrangement of the butterfly package is preferably retained so that the modified butterfly package can be used in conventional WTL circuit cards without further circuit card modification. Also, depending upon the specific implementation, it may be possible to mount the etalon directly in the butterfly package without an etalon chamber. The use of an etalon chamber to enclose the etalon, however, is preferred as it permits more precise control of the temperature of the etalon and reduces the risk that heat from the etalon might affect the functioning of the laser. In any case, by mounting the etalon inside the butterfly package, overall device size is further reduced.

Figure 16:
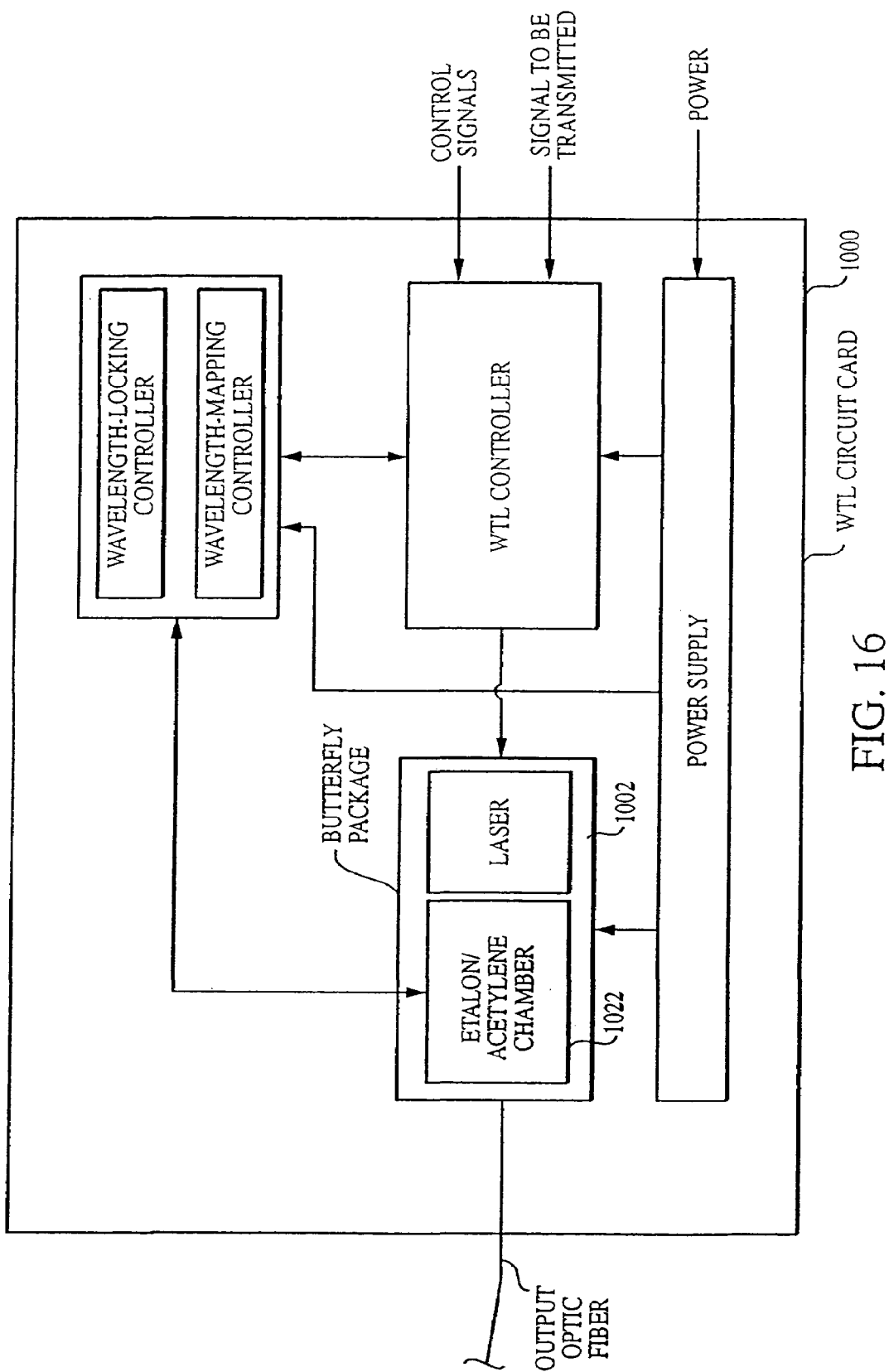
FIG. 16 illustrates a fifth exemplary embodiment of the WTL circuit card wherein a combined etalon/gas absorption chamber is mounted within the butterfly package along with the laser for use in wavelength mapping and wavelength locking the laser.

FIG. 16 illustrates another WTL circuit card 1000 wherein an etalon chamber 1022 is mounted within the butterfly package 1002, but wherein the etalon chamber also contains acetylene so as to function as a gas absorption chamber as well. The WTL circuit card is operated in the same manner as the circuit card of FIG. 14 to provide both wavelength-mapping and wavelength-locking. By mounting the etalon within the gas absorption chamber and mounting the gas absorption chamber inside the butterfly package, overall device size is still further reduced.

Etalon Calibration System

Figure 17:
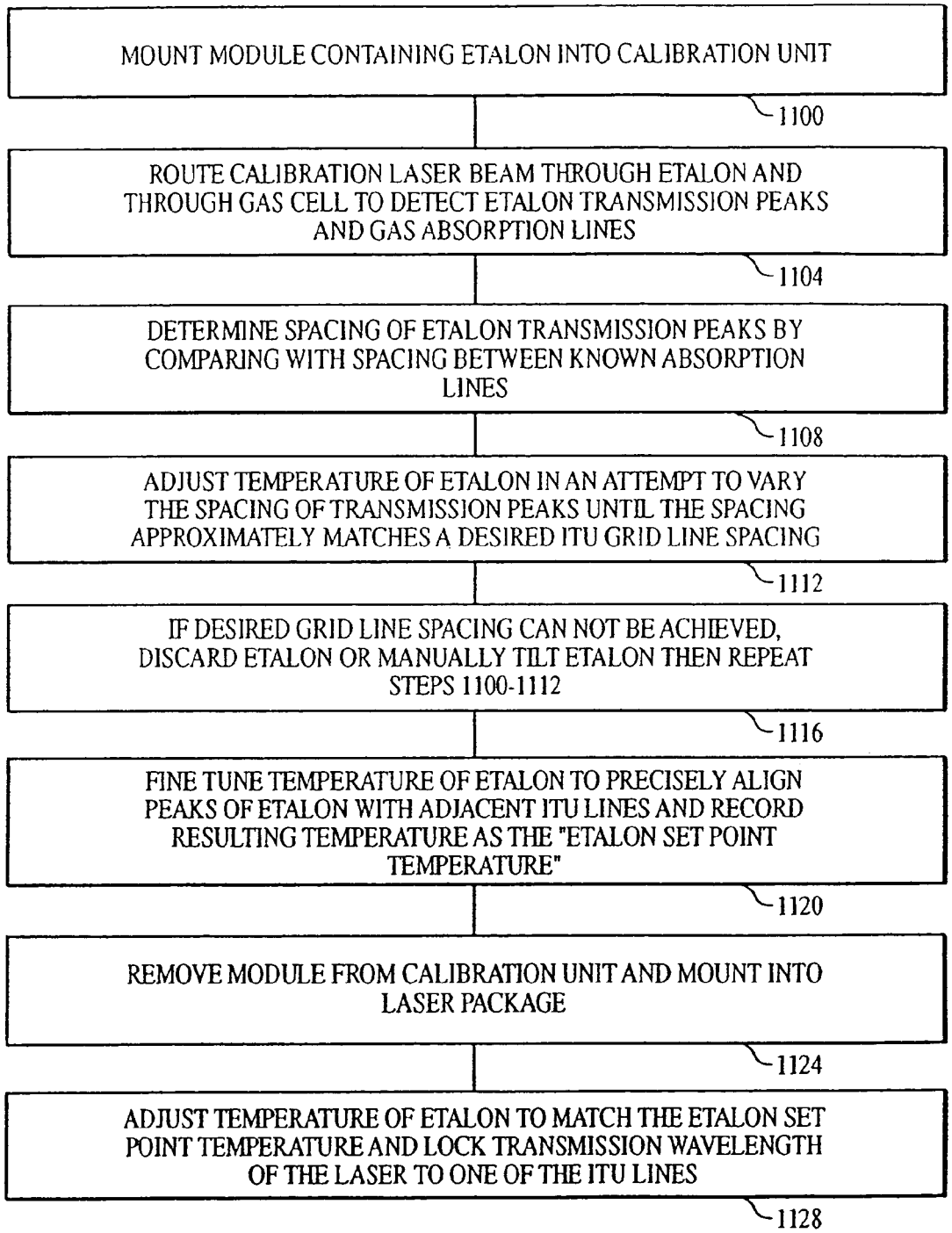
FIG. 17 illustrates a method for tuning an etalon to adjust the spacing and alignment of its FSR to match a predetermined ITU Grid Line spacing.

As the nature of the use of lasers or DWDM in which lasers are installed may prevent periodic mapping of the lasers for recalibration purposes, a technique that provides for a single calibration for a laser package is summarized in FIG. 17. The general method may be performed by an etalon calibration unit, such as the one illustrated in FIG. 18, to be described below, or by any other suitable device. The etalon to be calibrated in the calibration unit is later integrated into a laser package, such as the one illustrated in FIG. 19.

Figure 18:
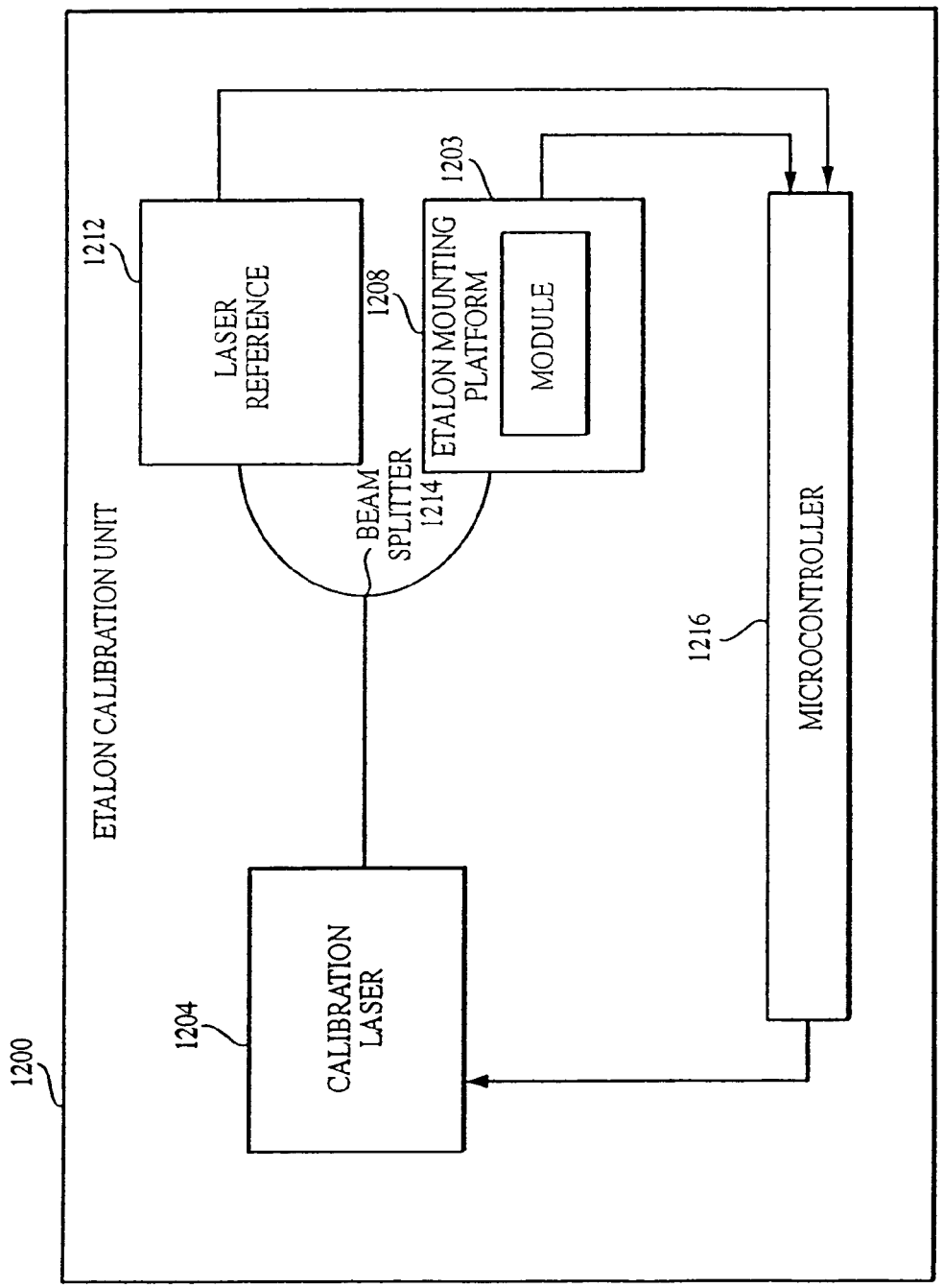
FIG. 18 illustrates an etalon calibration unit for use in accordance with the method enumerated in FIG. 17.

Initially, at step 1100 of FIG. 17, a module containing an etalon (such as etalon 620 of FIG. 12) and a detector is mounted within an etalon calibration unit FIG. 18. The etalon calibration unit 1200 includes a calibration laser 1204, a gas cell 1212 (or any other suitable device for comparing the transmission wavelengths of the calibration laser detected by the detector on the module with a known wavelength spacing), and a microcontroller 1216 coupled to leads on the module. At step 1104, the calibration laser transmits a beam through the etalon and through the gas cell while varying the wavelength of the laser beam. A resulting etalon transmission line spectrum and a resulting gas absorption line spectrum are detected for processing by the microcontroller. At step 1108, the microcontroller compares the spacing between adjacent transmission peaks of the etalon spectrum with the spacing between known absorption lines of the gas absorption spectrum to determine the absolute wavelength spacing of the transmission peaks. The spacing is compared to a desired predetermined ITU grid line spacing (such as the 40 channel C-band spacing), and if the spacing does not closely match the desired grid line spacing, the microcontroller applies heat to the etalon at step 1112 to adjust the temperature of the etalon until the transmission peak spacing approximately matches the desired ITU grid line spacing. If the spacing of the etalon transmission peaks cannot be adjusted to match the grid line spacing solely by the application of heat to the etalon or if the amount of heart required exceeds predetermined manufacturing tolerances, then at step 1116 the etalon is either discarded or is manually tilted within its package to approximate the desired spacing and steps 1100–1112 are repeated. Manual tilting of the etalon at step 1116 typically requires that the etalon be removed from the etalon package by severing whatever adhesive or other bonding material was used to mount the etalon within the etalon package and then re-mounting the etalon at a slightly different angle using additional adhesives or bonding materials.

Once the spacing between the etalon peaks is equivalent or within the allowable tolerances for the particular ITU grid line spacing, then at step 1120, the amount of heat applied to the etalon is slightly adjusted to shift the etalon transmission peaks until they align with the nearest ITU grid line. Note that the slight adjustment of the temperature is not sufficient to change the spacing of the etalon peaks beyond the desired tolerances, only the wavelengths of the peaks. (Other suitable tuning techniques can be used instead to tune the laser to a selected transmission wavelength). The resulting temperature of the etalon is recorded as the "etalon set point temperature." Then, at step 1124 the etalon module is removed from the calibration package and is eventually mounted within a laser such as a WTL of a DWDM. The microcontroller of the WTL is then programmed with the etalon set point temperature to permit the etalon to be quickly adjusted to align the transmission peaks of the etalon with selected ITU lines. Thereafter, if needed, the calibration of the etalon can be verified by using the wavelength mapper described above.

In one specific example, the DWDM employs a 160 channel protocol and the desired spacing between ITU grid lines is 25 GHz with an allowable variation in the etalon peak spacing of ±0.008 GHz, although each individual etalon peak may be within ±0.625 GHz of each individual ITU transmission line. Therefore, prior to installation into the laser package, a 1.71999 mm at 50° C. thick silicon etalon 1201 mounted on a module 1203 is placed within the etalon calibration unit 1200. If the initial spacing of the etalon peaks detected at step 1108 is not equal to 25 GHz±0.008 GHz, then the temperature of the etalon is adjusted (usually ±20° C. which adjusts the FSR by ±0.025 GHz) until the peaks are spaced at 25 GHz±0.008 GHz. If, at step 1108, the microcontroller detects that the FSR falls outside of the range of 25 GHz±0.025 GHz, then the etalon is discarded or is manually tilted by approximately 3 degrees or less to allow the FSR to align with the ITU grid lines. Fine tuning of the temperature of the etalon is adjusted slightly (usually ±0.5° C.) so that the etalon transmission peaks line up with the nearest ITU grid lines. For a 50 GHz spacing, a 2.066 mm at 50° C. thick fused silica etalon may be utilized.

This arrangement provides for more rapid switching by the laser between ITU channels as every etalon transmission peak remains associated with one of the ITU channels and the tuning parameters of the laser need only be accordingly adjusted. Furthermore, periodic recalibration of the laser is not required if the etalon is maintained at the predetermined temperature and the laser does not exhibit large amounts of hysteresis.

Figure 19:
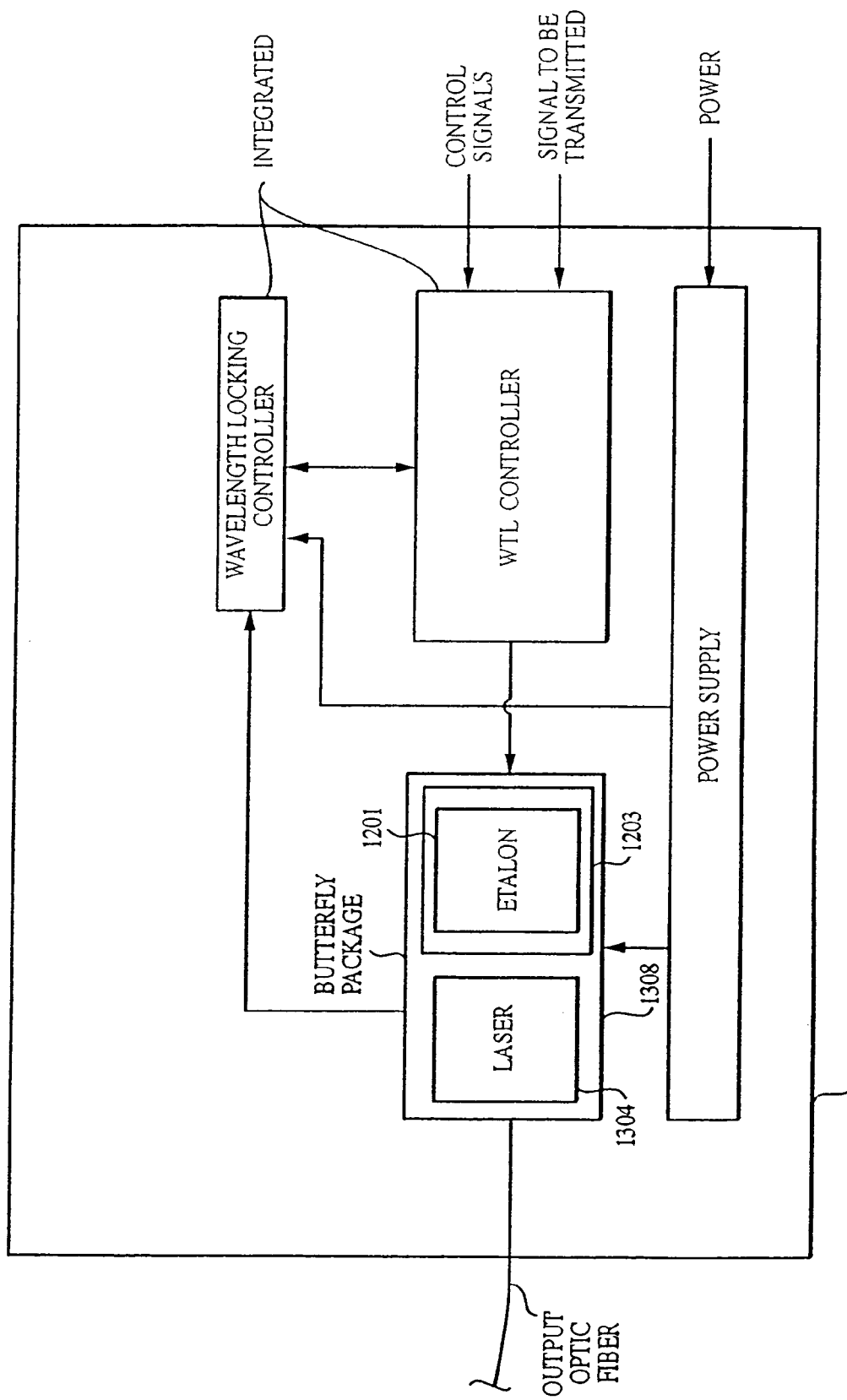
FIG. 19 illustrates a sixth exemplary embodiment of the WTL circuit card wherein a pre-tuned etalon module is mounted within the butterfly package along with the laser for use in wavelength locking the laser.

FIG. 19 illustrates a WTL circuit card 1300 wherein an etalon 1201 is mounted within a module 1203 separate from a laser 1304 that is mounted within a butterfly package 1308. Unlike the previously described WTL circuit card embodiments, no gas cell is required within the WTL. Also, rather than diverting light from the front laser facet, the etalon is mounted opposite the main output of the laser and receives light from the rear laser facet. A wavelength-locking controller of the WTL is programmed with the etalon set point temperature and then WTL is operated in the same manner as the circuit card of FIG. 15 to provide wavelength-locking.

Wavelength Lockers with Equally-Sized Detectors

FIGS. 20–29 illustrate various alternative embodiments of the wavelength lockers of FIG. 11 and FIG. 15 that provide wavelength locking but not wavelength mapping, i.e. the wavelength lockers lack a reference gas chamber for use in mapping the complete set of tuning parameters of the laser but include an etalon for use in locking the laser to a selected transmission wavelength once the appropriate tuning parameters are known. More specifically, the various embodiments of FIGS. 20–29 employ an arrangement of optical components configured so as to simplify wavelength locking.

Figure 20:
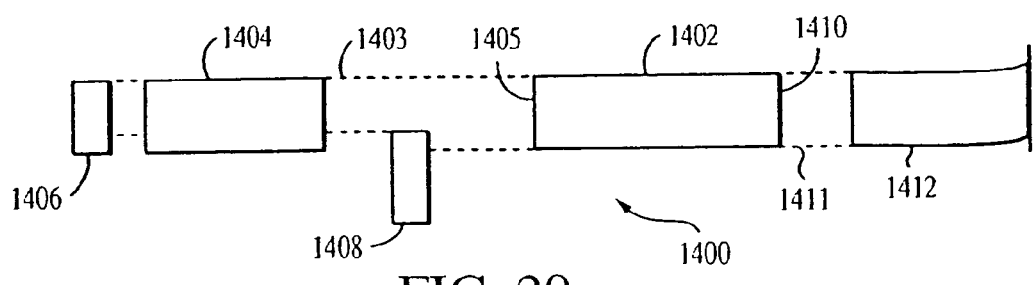
FIG. 20 illustrates an in-line arrangement of optical components for use in a wavelength locker, configured in accordance with yet another embodiment of the invention wherein a reference laser wavelength detector is slightly off-set from an optical axis of the laser.

FIG. 20 shows pertinent portions of a wavelength locker 1400 having a WTL laser 1402 for transmitting a laser beam 1403 via a rear facet 1405 through an etalon 1404 and to an etalon fringe detector 1406. A laser wavelength detector 1408 is interposed between the laser and etalon to capture a portion of the laser beam (to determine the power of the laser beam). Laser wavelength detector 1408 is slightly offset from an optical path of the laser beam to permit most of the light emitted from the rear facet of the laser to reach the etalon. The laser wavelength detector 1408 however captures a small portion of the light for use in detecting a reference wavelength of the laser. The wavelength locker employs the method of FIG. 9 to lock the output wavelength of the laser to an ITU grid wavelength by comparing signals detected by detectors 1406 and detector 1408. Simultaneously, the laser outputs a modulated beam 1411 through a front facet 1410 into an optic fiber 1412. The modulated output beam, transmitted along fiber 1412, is merged with beams from other WTL cards of a DWDM via a multiplexer for eventual transmission via a single optic fiber to a remote DWDM receiver. Note that FIG. 20 shows only pertinent selected components of the wavelength locker. Other components that may be needed, such as control circuitry, heating elements, thermistors, collimators, and the like, are illustrated in subsequent figures.

Figure 21:
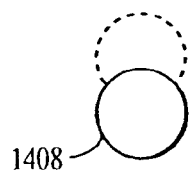
FIG. 21 illustrates the off-set reference laser wavelength detector of FIG. 20, for an example wherein the detector is round.
Figure 22:
FIG. 22 illustrates the reference laser wavelength detector of FIG. 20, for an example wherein the detector is not off-set from the axis of the laser beam but is instead annular.

Thus FIG. 20 illustrates an optical arrangement wherein the various components are mounted substantially in-line, i.e. the components are positioned along a common axis so as to provide a compact arrangement permitting installation in small butterfly or DIP packages. Also, by positioning laser wavelength detector 1408 directly in the path of the laser beam, rather than off-axis, ease of wavelength locking is achieved, as will be explained in detail below. Detector 1408 is preferably a round detector, as shown in FIG. 21, sized and positioned to capture about 30% of the light of beam 1403, permitting 70% to enter the etalon. In an alternative arrangement, shown in FIG. 22, the detector is aligned on-axis with beam 1403 but has an annular shape sized to capture an outer perimeter portion of the beam while permitting a center portion to pass directly to the etalon. Again, preferably, the detector captures about 30% of the light. The amount of light the detector captures need not be set to exactly 30% but in general can be set to any value sufficient to capture enough light to permit the detector operate. Other appropriate values are, for example, in the range of 20–40%. In both arrangements, detector 1408 receives light directly from the laser and rather than via a beam splitter as in the arrangement of FIG. 11.

Figure 23:
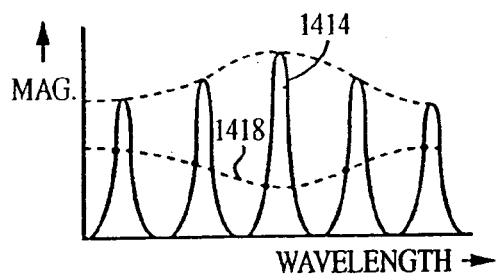
FIG. 23 is a graph illustrating signals received by a reference laser wavelength detector and an etalon detector for a non-in-line arrangement wherein a beam splitter is interposed between the laser and the detectors (as in FIG. 11).
Figure 24:
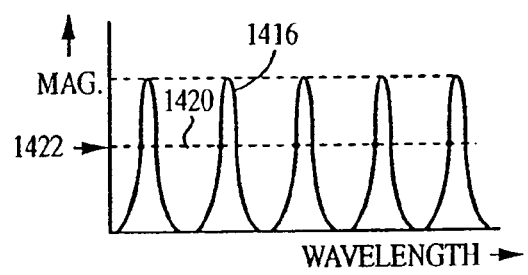
FIG. 24 is a graph illustrating signals received by the reference laser wavelength detector and etalon detector for the in-line arrangement of FIG. 20 wherein no beam splitter is interposed between the laser and the detector.

FIGS. 23 and 24 illustrate the magnitude of a laser signal as a function of wavelength as detected by a reference laser detector and an etalon detector for an off-axis arrangement (as in the arrangement of FIG. 11) and for an on-axis detector (as in the arrangement of FIG. 20). The dashed line 1418 of FIG. 23 is the signal detected by the laser reference detector. The solid line 1414 is the signal detected by the etalon detector, which includes various fringes. For the arrangement of FIG. 23, a beam splitter is used to split the laser beam into two separate beams—one to the laser wavelength detector and the other to the etalon detector. The beam splitter causes the amplitude of the reference signal (dashed line 1418) to vary as a function of wavelength. The beam splitter also causes the amplitude of the peaks of the fringes (solid line 1414) to vary as a function of wavelength. The amplitude variation in the reference signal and the etalon signal are out of phase because the beam splitter includes both transmissive and reflective components. For the on-axis arrangement of FIG. 24, there is no beam splitter and hence there is no wavelength variation in either the reference signal 1420 or the fringe peaks 1416. In other words, the two signals remain in phase.

Wavelength locking is achieved by detecting the wavelength at which one side of a fringe achieves a reference magnitude equal to half of the average fringe magnitude (1422 in FIG. 24) and then adjusting the laser in a feedback loop so as to prevent the laser from drifting. This is referred to as side locking (or slope locking) and is typically easier than attempting to detect the top of the fringe. So long as the ratio of the fringe magnitude to the reference magnitude remains constant (as in FIG. 24), then side locking is straightforward.

More specifically, side locking works by continually adjusting the laser wavelength to maintain a constant lock point ratio (i.e. a constant ratio of the etalon signal divided by the reference signal). In the on-axis arrangement, with the percentage of light on each detector properly adjusted, the reference detector signal cuts across the etalon detector signal at the half-amplitude point on each etalon peak, as shown by the dots in FIG. 24. In this case, the lock point ratio is exactly 1.0. Note though that the lock point ratio need not to be set to 1.0. The lock point ratio can be set to other values, so long as the control software of the wavelength locker is programmed with (or can automatically detect) the actual lock point ratio. Preferably, though, the lock point ratio is set to about 1.0. To achieve a lock point ratio as close as possible to 1.0, the laser reference detector should be mounted so that 30% of the light is captured by the laser reference detector while 70% passes through the etalon to the etalon detector. The half-amplitude point on the etalon peak then represents 35% of the total light, while 30% impinges on the reference detector. About 5% of the light is lost in passing through the etalon. Hence, about 30% of the total light signal reaches each detector at the half-amplitude point on the fringe thus achieving a lock point ratio of 1.0. And, most importantly, the lock point ratio does not vary from fringe to fringe and hence does not vary from ITU channel to ITU channel. In the off-axis arrangement of FIG. 23, the lock point ratio varies from fringe to fringe and hence also varies from ITU channel to ITU channel, thereby making side locking more difficult. To achieve precise side locking in the off-axis arrangement, the wavelength locker should be programmed to compensate based on the degree of phase modulation. The degree of phase modulation can either be pre-programmed into the control circuit of the wavelength locker or can be automatically determined by the wavelength locker. Although those skilled in the art can provide the necessary compensation programming, it is certainly preferable to configure the system to not require any such compensation.

Figure 25:
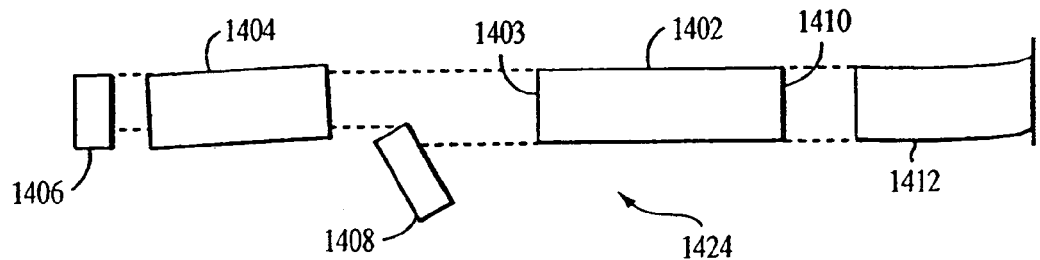
FIG. 25 illustrates the in-line arrangement of optical components of FIG. 20 wherein the laser wavelength detector and the etalon are both mounted at an angle to reduce reflections.

FIG. 25 illustrates a system 1424, which is a slight variation of the arrangement of FIG. 20. In system 1424, the reference wavelength detector 1408 is mounted at an angle between 30 and 45 degrees to the optical axis to ensure that any light reflected from the surface of the detector is reflected off-axis. Etalon 1404 is mounted at angle of between about one and three degrees (and preferably two degrees) to the optical axis, also to ensure that any reflected light is reflected off-axis.

Figure 26:
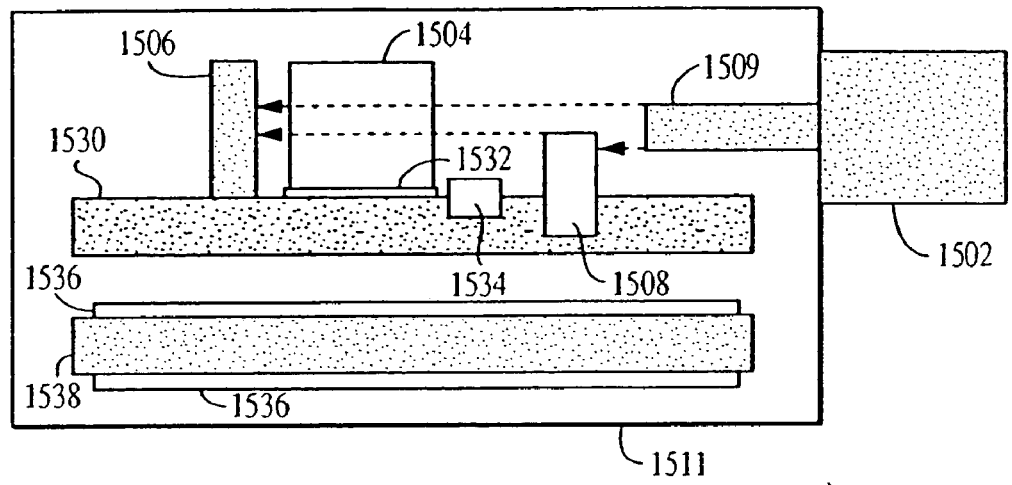
FIG. 26 illustrates an exemplary packaging arrangement for the optical components of FIG. 20 employing a pair of parallel substrates.
Figure 27:
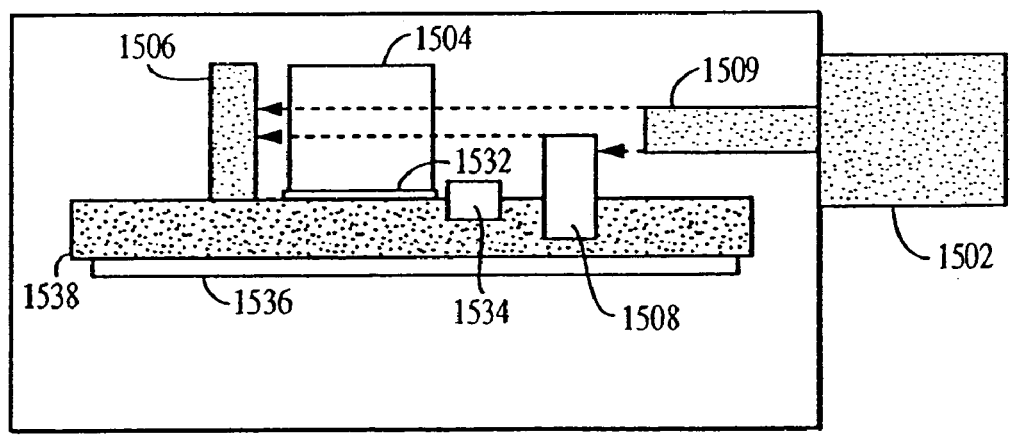
FIG. 27 illustrates another exemplary packaging arrangement for the optical components of FIG. 20 employing a single substrate.

FIGS. 26 and 27 illustrate a wavelength locker module 1500, such as a DIP or butterfly package, incorporating an on-axis optical wavelength locking system. A WTL laser (not shown) communicates with the module by a fiber 1503 which is coupled to a ferrule 1502 that is mounted to an outside surface of module. The module includes an etalon 1504, an etalon fringe detector 1506 and a laser wavelength detector 1508 arranged substantially as described in FIG. 26. A collimator 1509 is provided to initially collimate a beam received from the laser from the fiber. The collimator mounts to a ferrule mounted on the inner side surface of a housing 1511 of the module. Detectors 1506 and 1508 both mount directly to an upper substrate 1530 formed of FR4, which is affixed to inner side surfaces of the housing. Etalon 1504 is mounted to the substrate 1532 formed of Aluminum Nitride. A thermistor or other temperature sensor (i.e., a platinum resistor) 1534 is mounted on the upper substrate near to the etalon to detect the temperature of the etalon. A heating pad deposited on the substrate (not shown) on a portion positioned under the etalon heats the etalon under control of a control circuit 1536 to keep the temperature of the etalon constant as detected by the thermistor. The thermistor is not positioned directly on the etalon (as in the arrangement of FIG. 12) for ease of manufacturing. Care should be taken to ensure that the thermistor is mounted sufficiently close to the etalon to be able to reliable detect the temperature of the etalon. Control circuit 1536 is mounted to opposing sides of a lower substrate 1538, formed of ceramic, which is affixed to inner side surfaces of the housing. FIG. 27 illustrates a slightly different arrangement 1501, wherein there is only a single substrate. Control circuitry 1536 is mounted to an underside of substrate 1538, which is formed of FR4.

Figure 28:
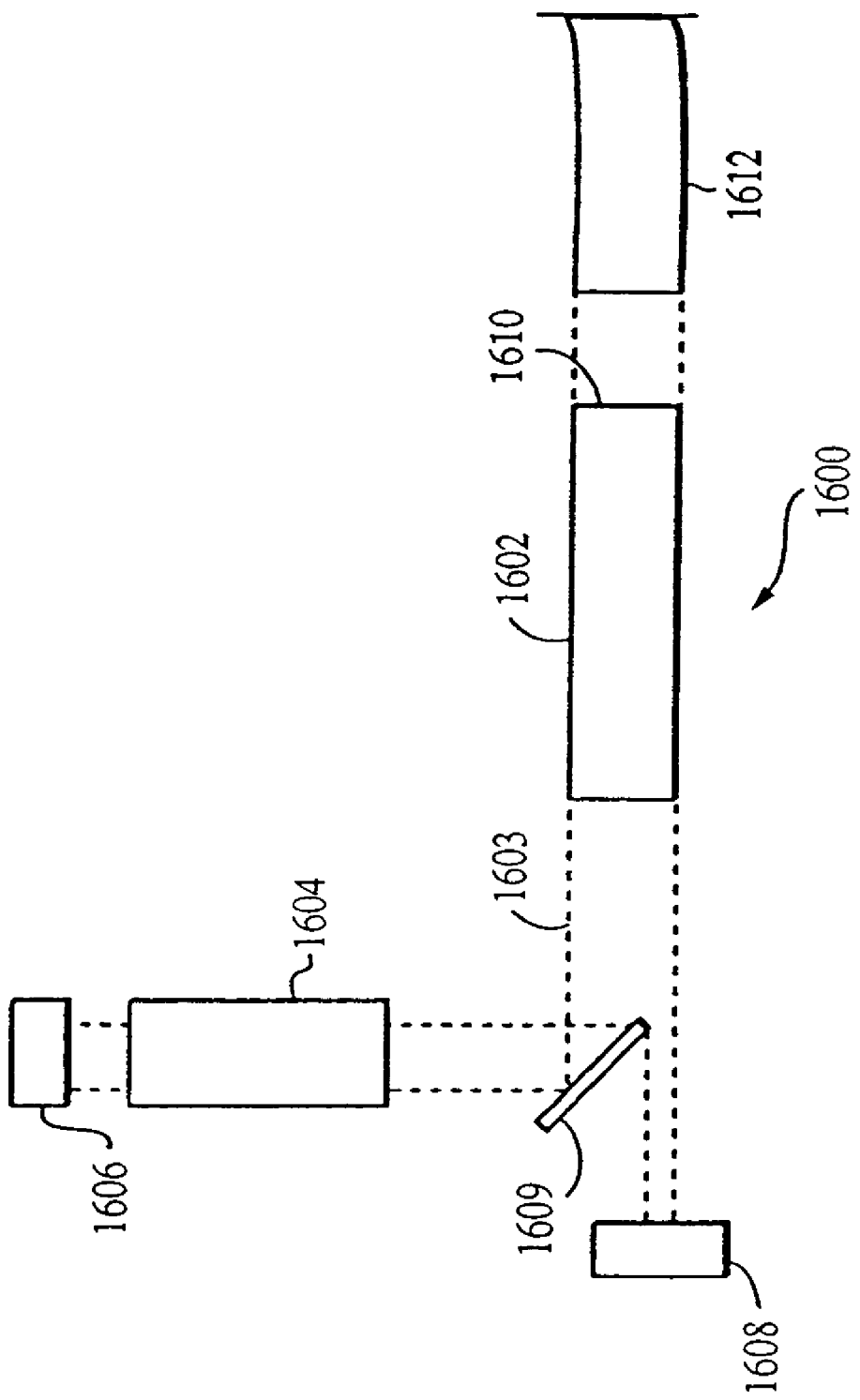
FIG. 28 illustrates an off-axis arrangement of optical components for use in a wavelength locker, wherein the etalon is mounted perpendicular to the optical axis of the laser.
Figure 29:
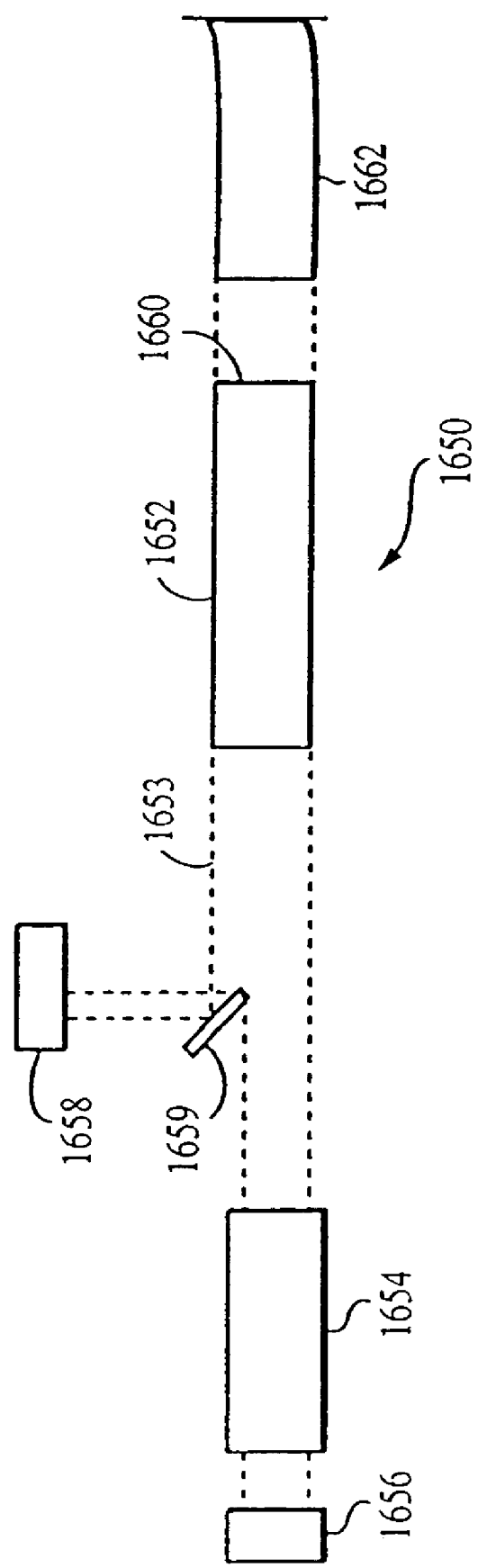
FIG. 29 illustrates another off-axis arrangement of optical components for use in a wavelength locker, but wherein the laser reference detector is mounted perpendicular to the optical axis of the laser.

Thus FIGS. 20–27 illustrate various on-axis optical arrangements, which are small in size and which ensure that the aforementioned phase modulation problems are avoided. In cases where size is either not critical and where an off-axis arrangement is more convenient, the arrangements of FIG. 28 or 29 are preferably used. The arrangements of FIGS. 28 and 29 are similar to that of FIG. 20 and only pertinent differences will be described. In FIG. 28, the etalon 1604 and etalon detector 1606 are mounted off-axis. A mirror 1609, or other appropriate reflective (but non-transmissive) device, is positioned so as to reflect a portion of laser beam 1603 to the etalon, while permitting remaining portions of the beam to pass directly to the laser wavelength detector 1608. In FIG. 29, the etalon 1654 and etalon detector 1656 are mounted on-axis. The mirror 1659 is positioned so as to reflect a portion of laser beam 1653 to the laser reference detector 1658, while permitting remain portions of the beam to pass directly to the etalon 1654. In both embodiments, the mirror is mounted so that about 30% of the beam is transmitted to laser wavelength detector and 70% to the etalon. As with the arrangement of FIGS. 20–27, no transmissive device is used reflect light to either the laser wavelength detector or the etalon detector, and hence the aforementioned phase modulation problems are avoided. In this regard, the mirror used to reflect portions of the laser beam does not result in a variation in the amplitude of the fringe peaks and hence does not result in the sort of modulation problems illustrated in FIG. 24.

What have been described thus far are various wavelength mapping and locking techniques for use in ensuring that the wavelength of a laser beam output from a WTL or other laser is locked to a particular ITU grid wavelength for transmission through an optic fiber. However, as described above, frequency chirp can affect signals transmitted along an optic fiber resulting in potentially significant distortion of the optical pulse, particularly over long haul optic fiber transmission systems. The distortion limits the maximum frequency of signal transmission modulation.

Chirp Filter

Figure 30:
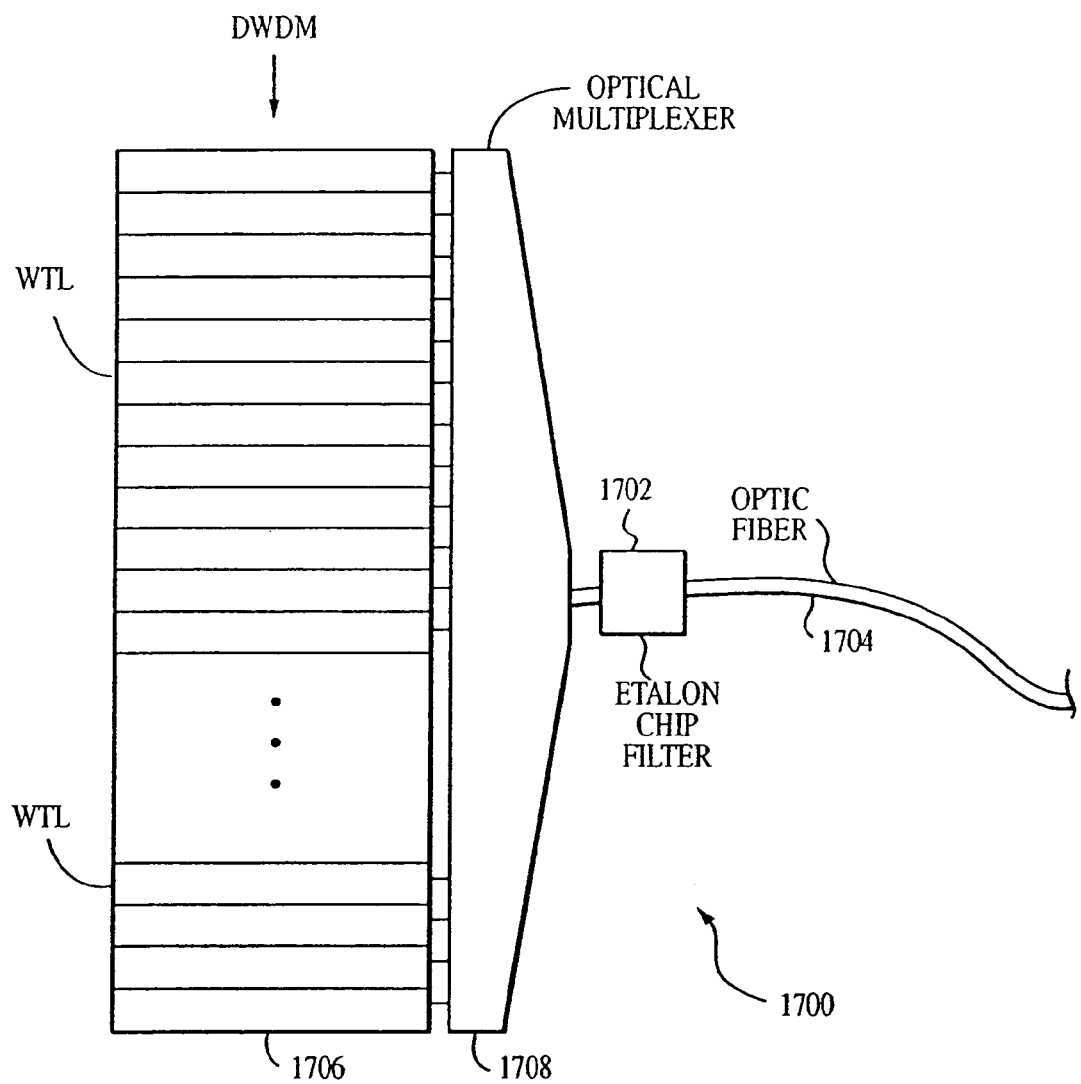
FIG. 30 illustrates a DWDM and an etalon chirp filter configured in accordance with yet another embodiment of the invention.
Figure 31:
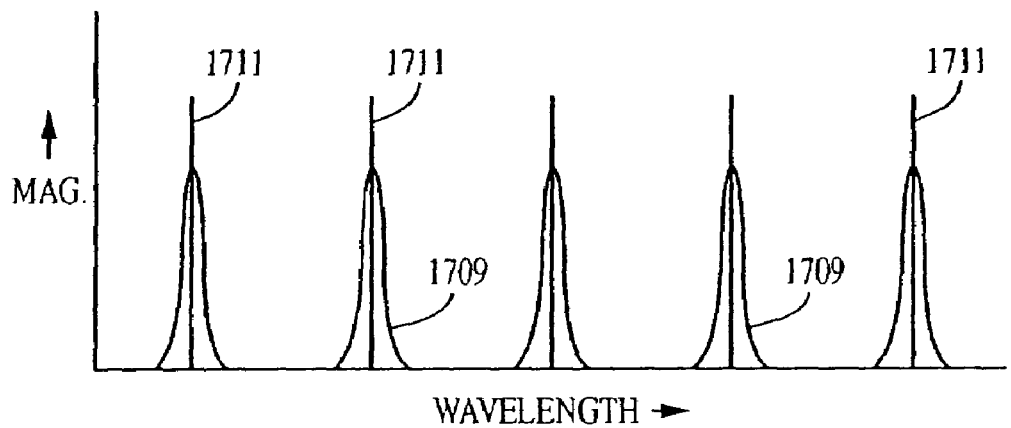
FIG. 31 is a graph illustrating the alignment of etalon fringes and ITU channels.
Figure 32:
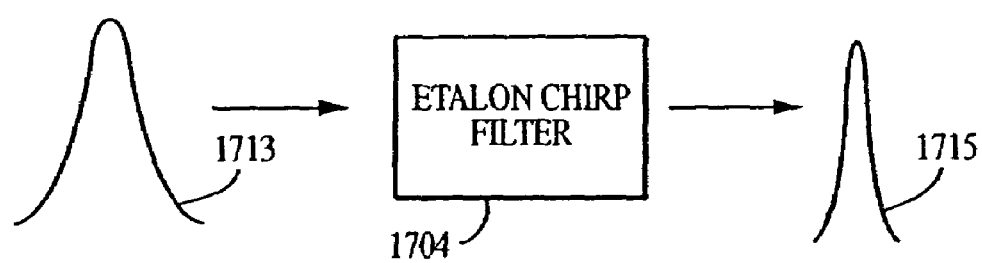
FIG. 32 is a graph illustrating an optical signal output form a DWDM being filtered by the etalon chirp filter of FIG. 30.

FIG. 30 illustrates an optical transmission system 1700 wherein an etalon chirp filter 1702 is provided for reducing or eliminating frequency chirp. The etalon chirp filter is mounted along an output optic fiber 1704 of a DWDM system configured to transmit optical signals at one or more of transmission frequencies of a selected ITU channel grid. The optical signals are generated using individual WTLs of a DWDM 1706, each tuned to a different ITU channel frequency, and are combined for transmission into the single optic fiber using an optical multiplexer 1708. The etalon is fabricated to have a FSR exactly equal to the minimum wavelength spacing of the selected ITU grid. Hence, if the system is configured to transmit at any one of the channels of the 40 channel C-band ITU system, an etalon with an FSR of 100 is used. If the system is configured to transmit at any one of the channels of the 80 channel C-band ITU system, an etalon with an FSR of 50 GHz is used. In either case, the etalon preferably has a finesse of about 25–50. As shown in FIG. 31, the etalon is tuned to align the etalon fringes 1709 with the ITU channel frequencies 1711. As shown in FIG. 32, when properly aligned, any portion of an optical transmission pulse 1713 transmitted from the DWDM into the etalon chirp filter 1704 at a frequency differing from one of the ITU frequencies is thereby filtered out by the etalon, yielding a filtered pulse 1715. Hence, only those portions of an optical pulse transmitted precisely at one of the ITU channel frequencies are coupled into the optic fiber. Those portions of the optical pulse having a slightly different frequency, perhaps as a result of optical frequency chirp, are blocked from entering the optic fiber.

Figure 33:
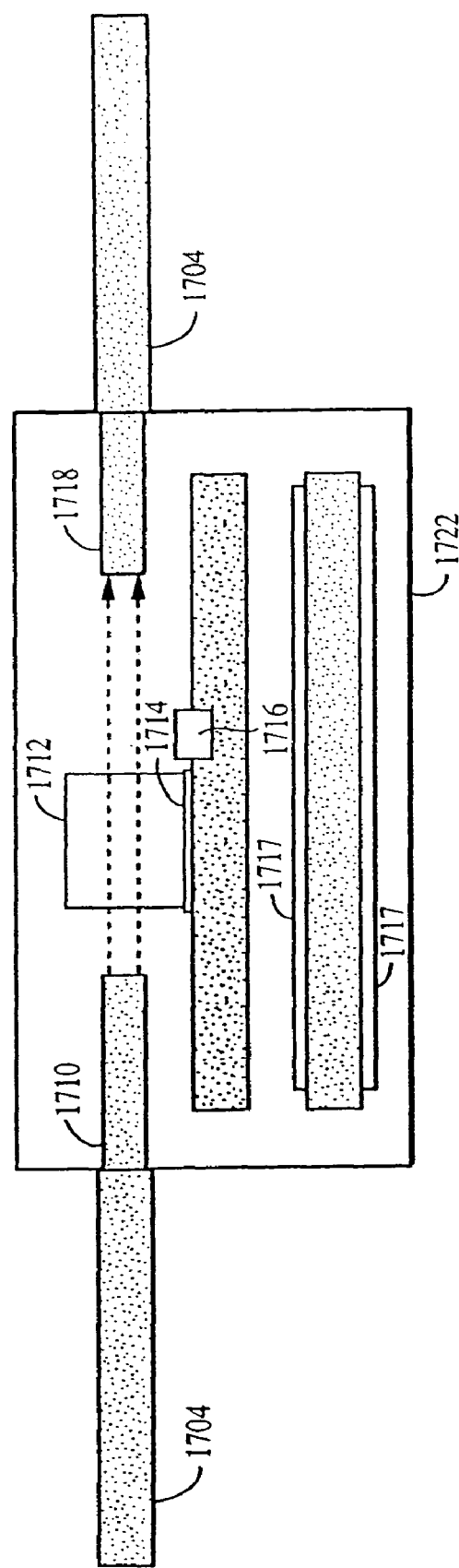
FIG. 33 illustrates internal components of the etalon chirp filter of FIG. 30.

FIG. 33 illustrates internal components of an exemplary etalon chirp filter. A collimator 1710 collimates optical signals received from output fiber 1704 for passing through etalon 1712. The temperature of the etalon is adjusted, as needed, by a heating element 1714 to maintain the fringes of the etalon aligned with the selected ITU channel grid frequencies. A thermistor or other temperature sensor 1716 is employed to detect the temperature of the etalon. The heating element is controlled by a control circuit 1717, which receives signals from the thermistor. The filtered optical signals emerging from the etalon are collimated again by a collimator 1718 for coupling back into optic fiber 1704 for transmission to a downstream DWDM. As with the arrangement of the wavelength locker of FIG. 26, the etalon and thermistor are preferably mounted to a substrate formed of FR4. The control circuitry is mounted to a second substrate formed of ceramic. The collimators and the two substrates are mounted to internal sides of an outer housing 1722.

Wavelength Lockers with Detectors of Unequal Size

Figure 34:
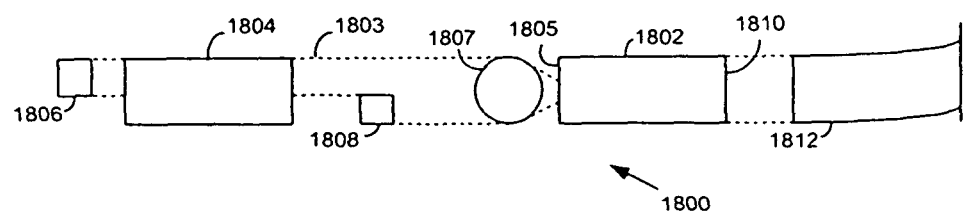
FIG. 34 illustrates an arrangement of optical components for use in a wavelength locker, configured in accordance with yet another embodiment of the invention, wherein the reference laser wavelength detector and the etalon detector are off-set from one another but both lie within the beam width of the laser.
Figure 35:
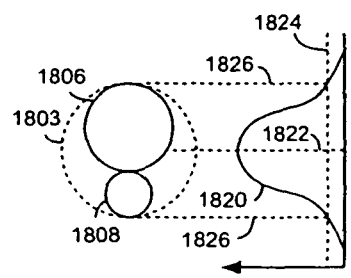
FIG. 35 illustrates the reference laser wavelength detector and etalon detectors of FIG. 34, for an example wherein outer perimeters of the two detectors are aligned with one another for use with a fairly narrow beam.
Figure 36:
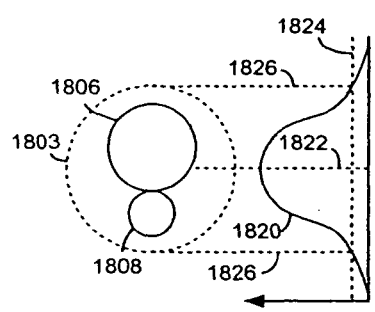
FIG. 36 illustrates the reference laser wavelength detector and etalon detector of FIG. 34, for an example wherein the laser beam is wider than the combined diameters of the two detectors.

FIGS. 34–36 illustrate additional alternative embodiments of the wavelength locker of the invention, which employ detectors of unequal size. FIG. 34 shows pertinent portions of a wavelength locker 1800 having a WTL laser 1802 for transmitting a laser beam 1803 via a rear facet 1805 through a ball lens 1807 into an etalon 1804 and onto an etalon fringe detector 1806. A laser wavelength detector 1808 is interposed between the laser and etalon to capture a portion of the laser beam and to determine the intensity of the laser beam. Laser wavelength detector 1808 and etalon fringe detector 1806 are offset from one another and from an optical axis of the laser beam, but are otherwise both positioned within the laser beam. The relative sizes of the two detectors are selected, based on the intensity profile of the beam, to achieve a lock point ratio of about 1.0 by ensuring that the etalon detector captures 7/3 times as much of the laser beam as laser wavelength detector captures. The wavelength locker employs the method of FIG. 9 to lock the output wavelength of the laser to an ITU grid wavelength by comparing signals detected by the laser reference detector and the etalon fringe detector. Simultaneously, laser 1802 outputs a modulated beam through a front facet 1810 into an output optic fiber 1812 for merging with the output beams from other DWDM WTL cards (not shown) for transmission through a single optic fiber to a remote DWDM receiver. Note that FIG. 34 shows only pertinent components of the wavelength locker. Other components that may be needed, such as control circuitry, heating elements, thermistors, collimators, and the like, are illustrated in subsequent figures.

FIG. 35 shows the relative sizes and orientations of etalon detector 1806 and laser reference detector 1808 taken along the axis of the laser beam. In the example of FIG. 35, the laser beam has a Gaussian intensity profile or pattern 1820 with maximum beam intensity along optical axis 1822 and with radially decreasing intensity away from the axis. The intensity eventually falls below a threshold intensity level 1824 at points 1826. The threshold intensity level is defined as a level equal to $1/e^2$ of the maximum intensity (or about 13.3% of the maximum intensity). The portion of the laser beam exceeding the threshold intensity defines a central beam 1803. As shown, detectors 1806 and 1808 are both positioned within the central beam and are offset from one another so each can capture an unobstructed portion of the central beam. Outer perimeter edges of the two detectors are aligned with the outer perimeter of the central portion 1803 of the laser beam. Inner perimeter portions of the detectors are aligned with one another.

Figure 37:
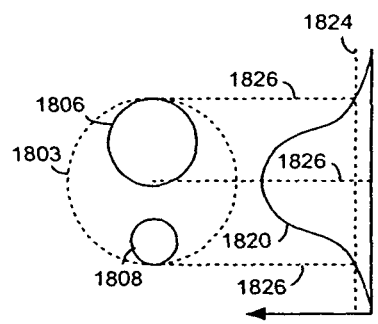
FIG. 37 illustrates the reference laser wavelength detector and etalon detector of FIG. 34, for an example wherein outer perimeters of the two detectors are offset from one another for use with a somewhat wider beam.

In one specific example, etalon detector 1806 has a detection area with a diameter of 300 microns whereas the reference laser wavelength detector has a diameter of 150 microns. Hence, the ratio of surface areas of the two detectors is 4/1. However, because the laser wavelength detector contains both detecting portions and non-detecting portions (i.e., the housing for the detectors), the resulting ratio of the amount of light captured by the two detectors is 7/3 rather than 4/1. Hence, a 70% to 30% detection ratio is achieved, suitable for providing a lock point ratio close to 1.0, as explained above in connection with FIG. 24. Note that ratio of light captured by the two detectors need not be set to exactly 7/3 but in general can be set to any value sufficient to achieve a lock point ratio near 1. Other appropriate ratios are, for example, in the range of 8/2 to 6/4. Hence, the ratio of the surface areas of the two detectors need not be 4/1 and the beam intensity need not have a strictly Gaussian profile. Also, the locations of the detectors relative to the central axis 1822 of the laser beam need not be exactly as shown in FIG. 35. For example, the outer perimeters of the detectors need not be aligned exactly with the perimeter of the central portion 1803 of the beam. Indeed, the central portion of the beam may be considerably larger than the combined diameters of the two detectors, as shown in FIG. 36. Also, the inner perimeters of the two detectors need not be aligned with one another. Rather, the detectors can be offset from one another as shown in FIG. 37. In general, the detectors may be sized and positioned in any suitable configuration that achieves a lock point ratio near 1.

Hence, a wide variety of alternative arrangements or configurations may be employed in accordance with the invention. The arrangements of FIGS. 34–37 are currently preferred because 300 micron and 150 micron detectors are readily available and the resulting surface area ratio of 4/1 facilitates achieving the approximately 1.0 lock point ratio for systems employing a Gaussian beam profile. In the arrangements of FIGS. 34–37, precise alignment of the detectors is not critical, in part, because the lock point ratio is affected primarily by the relative sizes of the two detectors rather than by their relative alignment. This is in contrast with the arrangement described above with reference to FIG. 20, wherein the two detectors are the same size and the lock point ratio is set by positioning the laser wavelength detector to occlude about 30% of the laser beam. In that arrangement, small variations in the location of the laser wavelength detector relative to the axis of the laser beam can have a more significant effect on the resulting lock point ratio. In particular, a variation in the positioning of the reference detector relative to the laser beam can decrease the amount of light collected by the reference detector while simultaneously increasing the amount of light passed on to the etalon (or vice versa), thereby requiring the wavelength locker to be fabricated to a fairly close manufacturing tolerance. The wavelength locker of FIGS. 34–37 need not be manufactured to the same tolerance as that of FIG. 20 and cost savings can thereby be achieved during fabrication. Also, the detectors of FIGS. 34–37 are smaller than those of FIG. 20 and cost savings are gained using the smaller detectors. Additionally, if a collimator is to be used, a relatively inexpensive ball lens may be employed, rather than a more expensive aspheric lens or GRIN lens, providing still further cost savings. The fact that the resulting collimated beam may be fairly sloppy will not significantly affect the lock point ratio because the central portion of the laser beam, in which the detectors are both mounted, will not likely exhibit any significant beam "sloppiness". Peripheral portions of the beam outside of the central beam 1803 may be sloppy but, with the detectors are mounted only within the central portion of the beam, the peripheral beam sloppiness will not likely have any significant effect. Also, the ball lens need not be positioned so as to achieve parallel output rays (as is shown in FIG. 34). The ball lens may instead be positioned to provide for a slightly diverging or converging beam (not shown), so long as the beam substantially encompasses both the laser wavelength detector and the etalon detector.

Optical Bench

Figure 38:
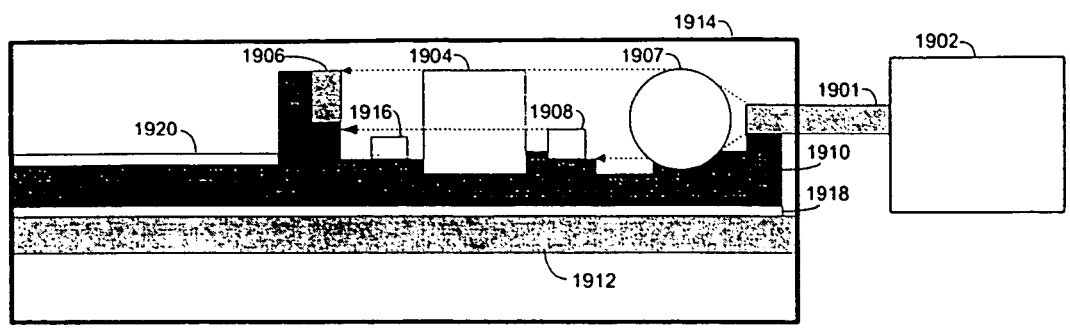
FIG. 38 is a cross-sectional side view of an exemplary packaging arrangement for the optical components of FIG. 34 employing an optical bench having slots and shelves for receiving a reference laser wavelength detector, etalon, etalon detector, ball lens and optic fiber to facilitate alignment and eutectic bonding.
Figure 39:
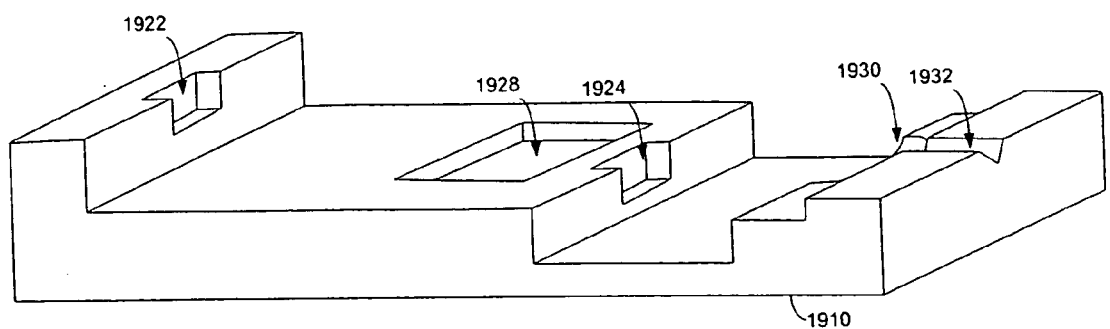
FIG. 39 provides a perspective view of the exemplary optical bench of FIG. 38.

FIGS. 38 and 39 illustrate various examples of a wavelength locker module 1900, such as a DIP or butterfly package, incorporating the optical arrangement of FIG. 37 and exploiting an optical bench for mounting and aligning the various components. Preferably the optical bench is made from silicon or aluminum nitride, although one of ordinary skill in the art will appreciate that there are numerous materials with similar thermal and mechanical properties. Referring first to FIG. 38, a WTL laser 1902 provides an input beam to the wavelength locker module via an optic fiber 1901. The module includes an etalon 1904, an etalon fringe detector 1906, a laser wavelength detector 1908, and a ball lens 1907, all mounted to an optical bench 1910. The optical bench is, in turn, supported by a substrate 1912, formed of FR4 or polyimide, which is affixed to the inner sides of a housing 1914. A thermistor or other temperature sensor 1916 is also mounted on the optical bench and is positioned near to the etalon to detect the temperature of the etalon (although it is preferred that the thermistor be mounted directly to the optical bench without an indentation as provided for with the other components). A heating pad 1918 is deposited between optical bench 1910 and the substrate 1912 for heating the optical bench so as to heat the etalon (and the other components mounted to the optical bench). Heating is controlled by a control circuit 1920 (which may be external or internal to the housing 1914). The control circuit controls the heating of the etalon in accordance with the wavelength locking techniques described above. Note that not all components of the wavelength locker are shown in FIG. 38. For example, interconnection lines and input/output pads are not illustrated.

Optical bench 1910 is illustrated more clearly in the perspective view of FIG. 39. The optical bench is formed to have various mounting slots and shelves for use in mounting the various optical components shown in FIG. 38. More specially, the optical bench includes a rear rectangular shelf 1922 for supporting the etalon fringe detector and a forward rectangular shelf 1924 for supporting the laser reference detector. The optical bench a forward rectangular slot 1928 for receiving a bottom portion of the etalon. A semicircular curved shelf or socket 1930 is shaped to receive and support the ball lens. A V-shaped slot 1932 receives the end of the input optic fiber. The dimensions of the optical bench are determined in advance to accommodate the size and shape of the individual components and to provide proper alignment of the components so as to permit wavelength locking with a lock point ratio of about 1.0. The specific dimensions depend, for example, on the focal length of the specific ball lens to be used. Note that a range of focal lengths can be accommodated with a single optical bench configuration by selectively positioning the end of the optic fiber relative to the ball lens.

In any case, once the optical bench has been fabricated to the correct dimensions for achieving a lock point ratio of about 1.0, the wavelength locker is then assembled as follows. Bottom portions of the various components and the top portion of the optical bench are metalized with, for example, a thin layer of gold. A 80%/20% gold/tin preformed is then placed on the optical bench and the components are then placed within their respective slots or shelves and the entire assembly is heated by an amount sufficient to trigger eutectic bonding of the metal with the optical bench. For a 80%/20% gold/tin preform, the preferred temperature for eutectic bonding is 283 degrees C. Care should be taken to use optical components capable of withstanding this temperature during the eutectic bonding step. Once eutectic bonding is achieved, the components are thereby securely mounted to the optical bench and proper alignment is assured to ensure the lock point ratio of about 1.0. No potentially costly post-mounting adjustments need be performed to re-position the detectors relative to the laser beam. Also, no epoxies are used in the assembly and hence possible disadvantages that may arise while using epoxies, such as the risk of out-gassing, are avoided.

The optical bench of FIGS. 38 and 39 is advantageously employed for use with WTLs providing an un-collimated optical beam via an input optic fiber (i.e. fiber 1901 of FIG. 38). As noted, a ball lens is included for collimation and a V-shaped slot is provided for permanently mounting an end of the optical fiber at a point near the ball lens (FIG. 38). In one variation, a ferrule is provided for mounting the end of an optic fiber inside he housing of the wavelength locker at the proper distance from the ball lens so as to achieve the requisite lock point ratio. Still other arrangements may be provided consistent with the principles of the invention. For example, depending upon the particular configuration, the advantages of the optical bench of FIGS. 38 and 39 can be exploited in connection with any of the optical configurations described herein rather than just the arrangement of FIG. 37.

The exemplary embodiments have been primarily described with reference to block diagrams illustrating pertinent components of the embodiments. It should be appreciated that not all components of a complete implementation of a practical system are necessarily illustrated or described in detail, nor are all of the varying component layout schema described. Rather, only those components and architectures necessary for a thorough understanding of the invention have been illustrated and described in detail. Actual implementations may contain more components or, depending upon the implementation, fewer components. Modifications to the preferred embodiments will be apparent to those skilled in the art. For example, in embodiments employing reflective surfaces other reflective surfaces, such as a MEMS mirror, can instead be used. Consequently, the scope of the present invention should not be limited by the particular embodiments discussed above, but should be defined only by the claims set forth below and equivalents thereof.

What is claimed is:

1. A system for use in locking a transmission wavelength of a laser beam to a selected wavelength comprising:
a laser wavelength detector, positioned along an optical path of the laser beam, for capturing a first portion of the laser beam to detect the power of the laser;
an etalon positioned along the optical path of the laser beam downstream from the laser wavelength detector for simultaneously receiving a second portion of the laser beam and for splitting the second portion into a series of etalon transmission lines; and
an etalon wavelength detector, positioned along the optical path of the laser beam downstream from the etalon, for detecting the etalon transmission lines; and
wherein the laser wavelength detector and etalon wavelength detector are both offset from one another and from a central axis of the laser beam and collectively provide a combined detection area smaller than a beam width of the laser beam; and
wherein the laser wavelength detector and the etalon wavelength detector are positioned so that a signal generated by the laser wavelength detector in response to capturing the first portion of the laser beam is substantially equal to a signal generated by the etalon wavelength detector in response to detected etalon transmission lines.

2. The system of claim 1 further including:
a laser for providing the laser beam; and
a control unit for setting the transmission wavelength of the laser to a selected wavelength and also for resistively heating the etalon to align a selected one of the etalon transmission lines to the selected wavelength, the control unit there after detecting any drift of the transmission wavelength of the laser from the selected etalon transmission line and adjusting the laser to compensate for any drift such that the output beam of the laser is locked to the selected transmission wavelength so long as the selected etalon transmission line remains at the selected wavelength.

3. The system of claim 1 wherein the laser wavelength detector and the etalon wavelength detector are circular detectors having center points diametrically opposite from one another on opposing sides of the central axis of the laser beam.

4. The system of claim 3 wherein outer perimeter edges of the laser wavelength detector and the etalon wavelength detector lie within a central cross-sectional portion of the laser beam.

5. The system of claim 4 wherein outer perimeter edges of the laser wavelength detector and the etalon wavelength detector are aligned with an outer perimeter of the central cross-sectional portion of the laser beam.

6. The system of claim 5 wherein the intensity of the laser beam diminishes off-axis and wherein the outer perimeter of the central cross-sectional portion of the laser beam is defined as the point where the intensity of the beam diminishes to $1/e^2$ of an on-axis beam intensity.

7. The system of claim 3 wherein the laser wavelength detector and the etalon wavelength detector are mounted perpendicular to a central axis of the laser beam, the central cross-sectional portion of the laser beam has a diameter of at least 450 microns, the laser wavelength detector has a diameter of about 150 microns, and the etalon wavelength detector has a diameter of about 300 microns.

8. The system of claim 1 wherein the etalon detector and the laser wavelength detector are sized relative to one another so as to capture an amount of light from the laser beam in the ratio of about 7/3.

9. The system of claim 1 wherein the laser wavelength detector and the etalon wavelength detector are mounted perpendicular to the central axis of the laser beam and a ratio of a surface area of the etalon wavelength detector to a surface area of the laser wavelength detector is about $\sqrt{7/3}$.

10. The system of claim 1 further including a collimator mounted along the laser beam between a source of the laser beam and the laser wavelength detector.

11. The system of claim 10 wherein the collimator is a ball lens.

12. The system of claim 1 further including an optical bench and wherein the laser wavelength detector, the etalon, and the etalon wavelength detector are all mounted to the optical bench.

13. The system of claim 12 wherein the laser wavelength detector, the etalon, and the etalon wavelength detector are all mounted to the optical bench via eutectic coupling.

14. The system of claim 12 wherein the laser beam is provided by an optic fiber and wherein an end of the optic fiber is also mounted to the optical bench.

15. The system of claim 14 further including a ball lens mounted between the optic fiber and the laser wavelength detector and wherein ball lens is also mounted to the optical bench.

16. The system of claim 15 wherein the optical bench is formed with slots sized to receive portions of the laser wavelength detector, the etalon, the etalon wavelength detector, the lens and the end of the optic fiber for mounting.

17. The system of claim 12 wherein the optical bench is mounted to a base with a heating element mounted therebetween.

18. The system of claim 17 wherein the base is formed of FR4 or polyimide.

19. A system for use in locking a transmission wavelength of a laser beam of a laser to a selected wavelength comprising:
means, positioned along an optical path of the laser beam, for capturing a first portion of the laser beam to detect the power of the laser;
means, positioned along the optical path of the laser beam downstream from the means for capturing a first portion of the laser beam to detect the power of the laser, for simultaneously receiving a second portion of the laser beam and for splitting the second portion into a series of etalon transmission lines; and
means, positioned along the optical path of the laser beam downstream from the means for simultaneously receiving a second portion of the laser beam and for splitting the second portion into a series of etalon transmission lines, for detecting the etalon transmission lines; and
wherein the means for capturing a first portion of the laser beam and the means for detecting the etalon transmission lines are both offset from one another and from a central axis of the laser beam and collectively provide a combined detection area smaller than a beam width of the laser beam;

wherein the means for capturing a first portion of the laser beam and the means for detecting the etalon transmission lines are positioned so that a signal generated by the means for capturing a first portion of the laser beam in response to capturing the first portion of the laser beam is substantially equal to a signal generated by the means for detecting the etalon transmission lines in response to detected etalon transmission lines.

20. A method for fabricating a wavelength locker for use in locking a transmission wavelength of a laser beam of a laser to a selected wavelength, the method comprising the steps of:
   mounting a laser wavelength detector along an optical path of the laser beam for use in capturing a first portion of the laser beam so as to detect the power of the laser, the laser wavelength detector being mounted offset from a central axis of the laser beam and sized to capture a first portion of the laser beam;
   mounting an etalon along the optical path of the laser beam downstream from the laser wavelength detector for use in simultaneously receiving a second portion of the laser beam and for splitting the second portion into a series of etalon transmission lines; and
   mounting an etalon wavelength detector along the optical path of the laser beam downstream from the etalon wavelength detector for use in detecting the etalon transmission lines, the etalon wavelength detector being mounted offset from the central axis of the laser beam;
   wherein the laser wavelength detector and the etalon wavelength detector are positioned so that a signal generated by the laser wavelength detector in response to capturing the first portion of the laser beam is substantially equal to a signal generated by the etalon wavelength detector in response to detected etalon transmission lines.

21. A laser system comprising:
   a laser for generating a laser beam;
   a laser wavelength detector, positioned along an optical path of the laser beam, for capturing a first portion of the laser beam to detect a transmission wavelength of the laser;
   an etalon positioned along the optical path of the laser beam downstream from the laser wavelength detector for simultaneously receiving a second portion of the laser beam and for splitting the second portion into a series of etalon transmission lines;
   an etalon wavelength detector, positioned along the optical path of the laser beam downstream from the etalon, for detecting the etalon transmission lines; and a control unit for setting the transmission wavelength of the laser to a selected wavelength and also for tuning the etalon to align a selected one of the etalon transmission lines to the selected wavelength, the control unit thereafter detecting any drift of the transmission wavelength of the laser from the selected etalon transmission line and adjusting the laser to compensate for any drift;
   wherein the laser wavelength detector and etalon wavelength detector are both offset from one another and from a central axis of the laser beam and collectively provide a combined detection area smaller than a beam width of the laser beam; and
   wherein the laser wavelength detector and the etalon wavelength detector are positioned so that a signal generated by the laser wavelength detector in response to capturing the first portion of the laser beam is substantially equal to a signal generated by the etalon wavelength detector in response to detected etalon transmission lines.

22. A laser multiplexer system comprising:
   a plurality of lasers each operative to generate a laser beam;
   a plurality of wavelength lockers each operative to lock the wavelength of a respective one of the lasers to a respective transmission wavelength; and
   an optical multiplexer operative to combine the plurality of laser beams into an optic fiber for transmission; and
   wherein each wavelength locker includes a laser wavelength detector, positioned along an optical path of the laser beam of the respective laser, for capturing a first portion of the laser beam of the respective laser to detect the power of the respective laser, an etalon positioned along the optical path of the laser beam of the respective laser downstream from the laser wavelength detector for simultaneously receiving a second portion of the laser beam of the respective laser and for splitting the second portion into a series of etalon transmission lines, and an etalon wavelength detector, positioned along the optical path of the laser beam of the respective laser downstream from the etalon, for detecting the intensity of the etalon transmission line, and a control unit for setting the transmission wavelength of the respective laser to the selected wavelength and also for tuning the etalon to align a selected one of the etalon transmission lines to the selected wavelength, the control unit thereafter detecting any drift of the transmission wavelength of the respective laser from the selected etalon transmission line and adjusting the respective laser to compensate for any drift, and wherein the laser wavelength detector and etalon wavelength detector are both offset from one another and from a central axis of the laser beam of the respective laser and collectively provide a combined detection area smaller than a beam width of the laser beam, and wherein the laser wavelength detector and the etalon wavelength detector are positioned so that a signal generated by the laser wavelength detector in response to capturing the first portion of the laser beam is substantially equal to a signal generated by the etalon wavelength detector in response to detected etalon transmission lines.

23. A system for use in locking a transmission wavelength of a laser to a selected wavelength comprising:
   a laser having an output beam exiting therefrom along an optical path;
   a laser wavelength detector, positioned along an initial linear portion of the optical path of the laser, for capturing a first portion of the output beam of the laser to detect a transmission wavelength of the laser;
   an etalon positioned along the initial linear portion of the optical path of the laser downstream from the laser wavelength detector for receiving a second portion of the output beam of the laser and for splitting the second portion into a series of etalon transmission lines; and
   an etalon wavelength detector for detecting the etalon transmission lines;
   wherein the laser wavelength detector and the etalon wavelength detector are positioned so that a signal generated by the laser wavelength detector in response to capturing the first portion of the laser beam is substantially equal to a signal generated by the etalon wavelength detector in response to detected etalon transmission lines.

24. The system of claim 23 further including: a control unit for setting the transmission wavelength of the output beam of the laser to a selected wavelength and also for tuning the etalon to align a selected one of the etalon transmission lines to the selected wavelength, the wavelength-locking control unit thereafter detecting any drift of the transmission wavelength of the laser from the selected etalon transmission line and adjusting the laser to compensate for any drift such that the output beam of the laser is locked to the selected transmission wavelength so long as the selected etalon transmission line remains at the selected wavelength.

25. The system of claim 23 wherein the laser is a widely tunable laser.

26. The system of claim 25 wherein the laser wavelength detector is round and a perimeter portion thereof is interposed along the initial linear portion of the optical path of the laser to capture the first portion of the beam.

27. The system of claim 25 wherein the laser wavelength detector includes a through hole formed therein and wherein an annular portion of the laser wavelength detector captures the first portion of the beam.

28. The system of claim 25 wherein the laser wavelength detector is mounted so as to capture 20% to 40% of the output beam of the laser before the beam reaches the etalon.

29. The system of claim 28 wherein the laser wavelength detector is positioned so as to capture 30% of the output beam of the laser before the beam reaches the etalon.

30. The system of claim 25 wherein the laser wavelength detector is positioned at an angle to the initial linear portion of the optical path of the laser.

31. The system of claim 30 wherein the laser wavelength detector is positioned at an angle of 30 to 45 degrees to the initial linear portion of the optical path of the laser.

32. The system of claim 23 wherein the etalon is positioned off-angle to initial liner portion of the optical path of the laser and wherein the system further includes a beam splitter positioned between the laser and the laser wavelength detector for reflecting the second portion of the laser beam to the etalon, the beam splitter configured so as to not affect phase characteristics of the first portion of the beam reaching the laser wavelength detector.

33. The system of claim 23 wherein the laser wavelength detector, etalon, and etalon wavelength detector are mounted to a first substrate.

34. The system of claim 33 wherein the first substrate is formed of FR4.

35. The system of claim 23 wherein the control unit is mounted to a second substrate.

36. The system of claim 35 wherein the second substrate is ceramic.

37. The system of claim 23 wherein the laser wavelength detector, etalon, and etalon wavelength detector are mounted to a first side of a substrate and wherein the control unit is mounted to a second side of the substrate.

38. The system of claim 23 wherein the laser wavelength detector, etalon, and etalon wavelength detector are positioned along an optical path emanating for a first output facet of the laser and wherein an output optic fiber is positioned along an optical path emanating for a second output facet of the laser.

39. A system for use in locking a transmission wavelength of a laser to a selected wavelength comprising:
a laser having a laser beam exiting therefrom along an optical path;
means, positioned along an initial linear portion of the optical path of the laser, for capturing a first portion of the output beam of the laser to detect a transmission wavelength of the laser;
means for receiving a second portion of the output beam of the laser and for splitting the second portion into a series of etalon transmission lines; and means for detecting the etalon transmission lines;
wherein the means for capturing a first portion of the laser beam and the means for detecting the etalon transmission lines are along a single linear optical path; and
wherein the means for capturing a first portion of the laser beam and the means for detecting the etalon transmission lines are positioned so that a signal generated by the means for capturing a first portion of the laser beam in response to capturing the first portion of the output beam is substantially equal to a signal generated by the means for detecting the etalon transmission lines in response to detected etalon transmission lines.

40. A method for locking a transmission wavelength of a laser to a selected wavelength a laser wavelength detector, an etalon, an etalon wavelength detector and a control unit, the method comprising the steps of:
setting a transmission wavelength of the laser to a selected wavelength;
detecting a transmission wavelength of a laser by positioning the laser wavelength detector along an initial linear portion of an optical path of the laser and capturing a first portion of the output beam of the laser;
generating a series of etalon transmission lines along the liner portion by positioning the etalon so as to capture a second portion of the output beam of the laser;
detecting the etalon transmission lines using the etalon wavelength detector;
resistively heating the etalon to align a selected one of the etalon transmission lines to the selected wavelength;
detecting any drift of the transmission wavelength of the laser from the selected etalon transmission line; and
adjusting the laser to compensate for any drift, such that the output beam of the laser is locked to the selected transmission wavelength so long as the selected etalon transmission line remains at the selected wavelength;
wherein the laser wavelength detector and the etalon wavelength detector are positioned so that a signal generated by the laser wavelength detector in response to capturing the first portion of the laser beam is substantially equal to a signal generated by the etalon wavelength detector in response to detected etalon transmission lines.

41. An apparatus for maintaining a transmission wavelength of a laser beam at a selected wavelength, the apparatus comprising:
a laser wavelength detector for capturing a first portion of the laser beam to detect the power of the laser;
an etalon positioned along the optical path of the laser beam for capturing a second portion of the laser beam splitting the second portion into a series of etalon transmission lines; and
an etalon wavelength detector for detecting the etalon transmission lines; and
wherein the laser wavelength detector and the etalon wavelength detector are positioned so that a signal generated by the laser wavelength detector in response to capturing the first portion of the laser beam is substantially equal to a signal generated by the etalon wavelength detector in response to detected etalon transmission lines.

42. An apparatus for use in locking a transmission wavelength of a laser beam to a selected wavelength, the apparatus comprising:
an etalon for receiving a first portion of the laser beam and for splitting the second portion into a series of etalon transmission lines;
an etalon wavelength detector for detecting the etalon transmission lines; and
a laser wavelength detector for capturing a second portion of the laser beam to detect the power of the laser; and
wherein the laser wavelength detector is positioned between the laser and the etalon to block a portion of the laser beam that, in the absence of the laser wavelength detector, would be received by the etalon.

* * * * *